(12) United States Patent
Kumar et al.

(10) Patent No.: US 11,481,148 B1
(45) Date of Patent: Oct. 25, 2022

(54) SLEW RATE BOOSTING FOR COMMUNICATION INTERFACES

(71) Applicant: Cadence Design Systems, Inc., San Jose, CA (US)

(72) Inventors: Vinod Kumar, Uttar Pradesh (IN); Hajee Mohammed Shuaeb Fazeel, Karnataka (IN); Thomas Evan Wilson, Laurel, MD (US)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 0 days.

(21) Appl. No.: 17/362,352

(22) Filed: Jun. 29, 2021

(51) Int. Cl.
*G06F 3/06* (2006.01)
*H03K 17/0412* (2006.01)

(52) U.S. Cl.
CPC .......... *G06F 3/0658* (2013.01); *G06F 3/0611* (2013.01); *G06F 3/0673* (2013.01); *H03K 17/0412* (2013.01)

(58) Field of Classification Search
CPC .... G06F 3/0658; G06F 3/0611; G06F 3/0673; H03K 17/0412
USPC ....................................................... 327/183
See application file for complete search history.

(56) References Cited

U.S. PATENT DOCUMENTS

| 8,867,598 B1* | 10/2014 | Gagnon ............ H04L 25/03031 375/232 |
| 10,666,470 B2 | 5/2020 | Tayor et al. |
| 10,826,730 B1 | 11/2020 | Liu et al. |
| 10,958,484 B1 | 3/2021 | Fazeel et al. |

* cited by examiner

*Primary Examiner* — Tomi Skibinski
(74) *Attorney, Agent, or Firm* — Tarolli, Sundheim, Covell & Tummino LLP

(57) ABSTRACT

This disclosure relates to slew rate boosting for communication interfaces. A circuit can include a driver circuit coupled to an output node and configured to provide a data signal to the output node based on an input signal. The data signal can a similar logical state as the input signal. The circuit can include a signal transition boosting circuit coupled to the output node and configured to provide a boosting signal to the output node based on the input signal and a charge pump delay adjustment signal. The charge pump delay adjustment signal can define an amount of time after which the boosting signal is provided to the output node. The boosting signal can be provided to the output node to signal boost the data signal for the amount of time defined by the charge pump delay adjustment signal to provide a boosted data signal at the output node.

20 Claims, 9 Drawing Sheets

1200

1300

US 11,481,148 B1

SLEW RATE BOOSTING FOR COMMUNICATION INTERFACES

TECHNICAL FIELD

This disclosure relates to slew rate boosting for communication interfaces.

BACKGROUND

In electronics, a slew rate is defined as the change of voltage or current, or any other electrical quantity, per unit of time. Electronic circuits may specify a minimum or maximum limits on slew rates for respective inputs or outputs, with these limits only valid under some set of given conditions. When given for an output of a circuit, such as an amplifier, the slew rate specification guarantees that the speed of the output signal transition will be at least the given minimum, or at most the given maximum. When applied to an input of a circuit, it instead indicates that the external driving circuitry needs to meet those limits in order to guarantee the correct operation of the receiving device. If these limits are violated, some error might occur and correct operation is no longer guaranteed.

High bandwidth memory (HBM) is a high-performance random access memory (RAM) interface for 3D-stacked dynamic RAM (DRAM) and has been adopted by the Joint Electron Device Engineering Council (JEDEC) standards body. The HBM standard defines a new type of physical interface for communication between an HBM DRAM device and a host device, such as an application specific integrated circuit (ASIC), a central processing unit (CPU), a graphics processing unit (GPU), a field programmable gate arrays (FPGA), or another type of host device.

SUMMARY

The present disclosure relates to voltage slew rate boosting.

In an example, a circuit can include a driver circuit that can be coupled to an output node and configured to provide a data signal to the output node based on an input signal. The data signal can a similar logical state as the input signal. The circuit can further include a signal transition boosting circuit that can be coupled to the output node and configured to provide a boosting signal to the output node based on the input signal and a charge pump delay adjustment signal. The charge pump delay adjustment signal can define an amount of time after which the boosting signal is provided to the output node. The boosting signal can be provided to the output node to signal boost the data signal for the amount of time defined by the charge pump delay adjustment signal to provide a boosted data signal at the output node.

In yet another example, a system can include an interface circuit that can include a transmitter circuit that can include an output node and a driver circuit that can be coupled to the output node. The driver circuit can be configured to drive the output node for a period of time to provide electrical charge to the output node. The electrical charge can be provided to the output node for the period of time can be representative of a data signal in a respective logical state. The system can further include a signal transition boosting circuit that can be coupled to the output node. The signal transition boosting circuit can be configured to drive the output node for a portion of the period of time to provide additional electrical charge to the output node. The additional electrical charge being provided to the output node can be representative of a boosting signal. The boosting signal can be provided to the output node to signal boost the data signal for the portion of the period of time to provide a boosted data signal.

In a further example, a transmitter circuit can include an output node, a main driver circuit, and a boost driver circuit. The main driver circuit can include a main input drive circuit that can be configured to provide a driver signal based on an input signal in a respective logical state. The main driver circuit can further include an output driver circuit that can be coupled to the output node and can be configured to provide electrical charge for a period of time to the output node in response to the driver signal. The electrical charge that can be provided to the output node during the period of time can be representative of a data signal in a respective logical state. The respective logical state of the data signal can be similar to the respective logical state of the input signal. The boost driver circuit can include a boost input drive circuit that can be configured to provide a boost driver signal based on a boost timing signal being in a respective logical state for a portion of the period of time. The boost driver circuit can further include a boost driver circuit that can be coupled to the output node and can be configured to provide additional electrical charge to the output node during the portion of the period of time in response to the boost driver signal. The additional electrical charge that can be provided to the output node can be representative of a boosting signal. The boosting signal can be provided to the output node to signal boost the data signal for the portion of the period of time to provide a boosted data signal at the output node.

DETAILED DESCRIPTION

Figure 1:
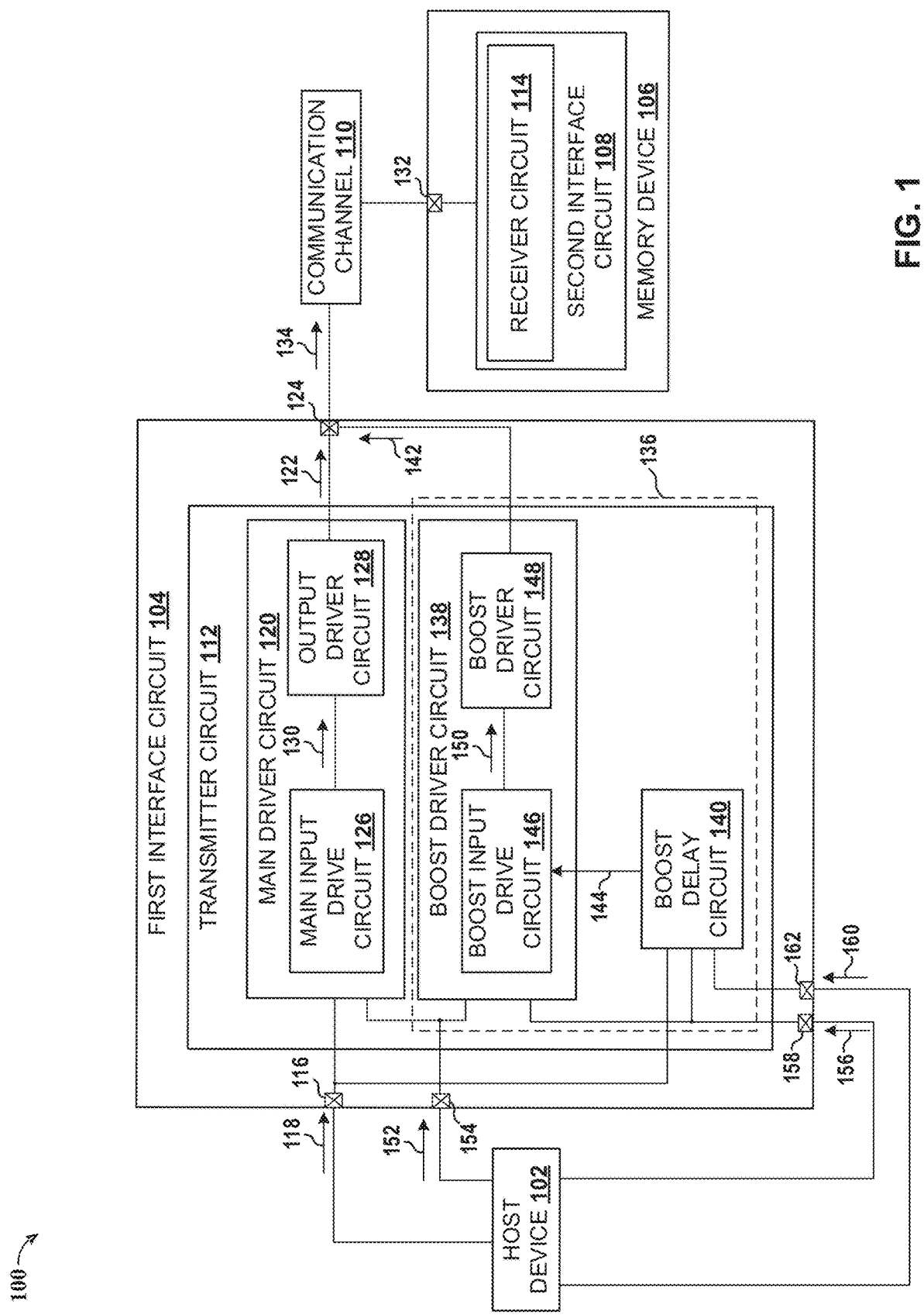
FIG. 1 is an example of a high speed interface.

This disclosure relates to voltage slew rate boosting of data signals in communication interfaces. Communication interfaces are used to communicate data signals between devices, such as a host device (e.g., a processor) and another device (e.g., a memory device). Each data signal can include one or more symbols that can represent logic states representative of digital values, such as 1's and 0's. The host device can be configured with a first interface circuit that includes a transmitter circuit that can be configured to generate the data signal and communicate the data signal over a (conductive) communication channel to a second interface circuit residing at the other device. The second interface circuit can include a receiver circuit for processing the data signal.

Because the communication channel is conductive, the communication channel may behave as a resistor-capacitor (RC) circuit and can exhibit resistive-capacitive properties (referred to as channel effects). The channel effects can impact a voltage slew rate of the data signal (e.g., a voltage rate at which an amplitude of the data signal changes over time) at the secondary device. This is because as electrical charges representing the data signal travel (or flow) down the communication channel away from the host device toward the other device, channel effects (e.g., resistive and capacitive effects) of the communication channel resist the flow of the electrical charges. The channel effects of the communication channel reduce a rate at which the electrical charges arrive at the memory device corresponding to a reduction in the voltage slew rate of the data signal at the secondary device.

As data transmission rates increase, a unit interval (UI) of the data signal decreases as the voltage slew rate of the data signal at the other device is reduced by the channel effects, which results in a timing loss at the secondary device (e.g., reduction in eye opening which results an eye width reduction and hence timing loss). This is because the rate at which the amplitude of the data signal changes over time at the other device is a function of the resistance and capacitance of the communication channel. Because the eye opening of the data signal is reduced this can lead to errors being introduced during sampling of the data signal at the other device. The channel effects can shift the data signal at the other device, such that a signal transition portion of the data signal (e.g., a signal portion of the data signal corresponding to a rising edge or falling edge) can occur at about a time that the receiver circuit samples the data signal. Thus, errors may be introduced by the receiver circuit into the sampled data signal, such that a determination of the symbol that is being represented by the sampled data signal may not be determined correctly. As a channel length of the communication channel increases, the channel effects can increase and reduce the voltage slew rate of the data signal at the other device, reducing the width of the data signal, in some instances, to levels that cause errors to be introduced into the sampled data signal.

Systems and methods are described herein for voltage slew rate boosting of data signals. According to the systems and methods described herein, the data signals can be boosted at a host device, such that once a boosted data signal arrives at another device (e.g., a memory device) over a communication channel, a value of a logical state represented by a symbol of a measured data signal can be more accurately determined. The boosted data signal at the memory device can have an increased signal transition rate and peak amplitude in contrast to a non-boosted data signal received at the memory device.

In some examples, a first interface circuit can be employed with a transmitter circuit. In some examples, the transmitter circuit as described herein can be referred to as a boosting transmitter circuit. In some examples, the host device includes the first interface circuit, and in other examples, the host device is coupled to the first interface circuit. The transmitter circuit can include a main driver circuit and a signal transition boosting circuit. The main driver circuit can be configured to receive an input signal that includes a symbol. The symbol can be representative of a first logical value (e.g., a logical one (1)) or a second logical value (e.g., a logical zero (0)). Thus, the input signal can be in a first logical state corresponding to the first logical value or a second logical state corresponding to the second logical value. The main driver circuit can be configured to output the data signal with the symbol representing a respective logical state to an output node (e.g., a pad) of the first interface circuit (or the host device, in examples, wherein the host device includes the first interface circuit) based on the input signal.

In some examples, the signal transition boosting circuit can be configured to output a boosting signal. The signal transition boosting circuit can be configured to output the boosting signal to the output node to boost the data signal for a period of time to increase a signal transition rate of the data signal. The term "signal transition rate" as used herein can refer to a rate at which a signal changes an amplitude during a signal transition portion of the signal. The signal transition portion can correspond to a rising or falling edge of the signal. Thus, the data signal can be modified by the voltage boosting circuit during the period of time at the output node, such that the data signal has a steeper slope in contrast to a data signal that is not signal boosted during the period of time (referred to herein as a non-boosted data signal). Accordingly, the signal transition boosting circuit can be configured to modify the data signal at the output node to provide a boosted data signal having a greater signal transition rate in contrast to the non-boosted data signal provided by a non-boosting transmitter circuit. The signal transition boosting circuit can be configured to modify the data signal during the period of time by providing electrical charges to the output node to cause a respective edge of the data signal to transition (e.g., change a voltage over time) at a greater signal transition rate in contrast to a respective edge of the non-boosted data signal provided by the non-boosting transmitter circuit.

In some examples, the data signal can be modified by the signal transition boosting circuit to provide the boosted data signal with an amplitude that increases above a first voltage reference during a first period of time. In some examples, the signal transition boosting circuit can be configured to positive boost (e.g., increase an amplitude of) the data signal to provide the boost data signal with an amplitude that is at about a second voltage reference during the first period of time. The second voltage reference can be greater than the first voltage reference. In some examples, the data signal can be modified by the signal transition boosting circuit to provide the boosted data signal with an amplitude that decreases below a third voltage reference during a second period of time. The third voltage reference can be less than the first voltage reference. In some examples, the voltage boosting circuit can be configured to negative boost (e.g., decrease the amplitude of) the data signal to provide the boosted data signal with an amplitude that is at about a fourth voltage reference during the second period of time. The fourth voltage reference can be less than the third voltage reference.

In some examples, the output node of the first interface circuit can be coupled to a communication channel, which can be coupled to an input node (e.g., a pad) of the memory device. The memory device can include a second interface circuit that can include a receiver circuit. In some examples, the second interface circuit includes the input node. The receiver circuit can be coupled to the input node. The boosted data signal can propagate over the communication channel to the input node of the memory device and thus to the receiver circuit.

By (selectively) boosting the data signal at the output node to provide the boosted data signal, once the boosted data signal arrives at the input node over the communication channel, the boosted data signal can have a greater signal transition rate corresponding to a greater voltage slew rate at the input node in contrast to the non-boosted data signal being received at the input node. This is because the respective edge of the boosted data signal can transition at a greater signal transition rate in contrast to the non-boosted data signal at the input node. Because the signal transition boosting circuit provided additional electrical charge to the output node during the first or second period of time the respective edge of the data signal can have an elevated signal transition rate at the output node in contrast to a corresponding edge of the non-boosted data signal at the output node. The elevated signal transition rate of the boosted data signal results in an improvement of an eye diagram for the receiver circuit by improving (e.g., increasing) an eye width and eye height of the eye diagram, which reduces or minimizes errors during data signal sampling. By increasing the eye width and eye height of the eye diagram a timing margin of the eye diagram can be improved.

FIG. 1 is an example of a high speed interface 100. The high speed interface 100 can include a host device 102. In some examples, the host device 102 is a processor, such as a CPU, a GPU, a tensor processor unit, a vector processor unit, a machine learning accelerator, a purpose build accelerator solution, or a different type of processing unit. In some examples, the host device 102 is an integrated circuit (IC), a system on a chip (SoC), an FPGA, an ASIC, or another logic device. The high speed interface 100 can be implemented on a computing platform, such as a desktop computer, a laptop computer, a cellular phone, a personal organizer, a portable audio player, a tablet, a control circuit, a camera, a smartwatch, a virtual reality headset, a network node, such as a router or a server, a copier, a scanner, a printer, a game console, a television, a set-top video distribution or a recording system, a cable box, a personal digital media player, a factory automation system, an automotive computer system, or a medical device. In other examples, a different type of computing platform may be used for implementing the high speed interface 100, as described herein.

In some examples, the high speed interface 100 includes a first interface circuit 104. While the example of FIG. 1 illustrates the first interface circuit 104 as being separate from the host device 102, in other examples, the host device 102 can include the first interface circuit 104. In some examples, the host device 102 and the first interface circuit 104 can be implemented as a SoC, or with standalone components. In some examples, the first interface circuit 104 can be representative of a memory controller. In further examples, the memory controller can be part of the host device 102, such as logic implemented on a same die or implemented in a same package space as the host device 102. In some examples, the first interface circuit 104 can be representative of one or more controller circuits or devices for the high speed interface 100.

In some examples, the first interface circuit 104 is a chip-to-chip interface (or interconnect) and can provide a communication bridge between the host device 102, and another device, such as a memory device 106. While the example of FIG. 1 illustrates the other device as the memory device 106, in other examples, the memory device 106 may be a non-memory device. In some examples, the memory device 106 can be implemented as a memory module (e.g., a board). By way of example, the memory device 106 may be implemented as a dual in-line memory module (DIMM). In additional or alternative examples, the memory device 106 may be implemented as a double data rate type (DDR) device. Thus, in some examples, the memory device 106 can be implemented as a double data rate 3 (DDR3) device, a double data rate 4 (DDR4) device, a low power DDR3 (LPDDR3) device, a low power DDR4 (LPDDR4) device, a Wide I/O 2 (WIO2) device, a high bandwidth memory (HBM) dynamic random-access memory (DRAM) device, an HBM 2 DRAM (HBM2 DRAM) device, an HBM 3 DRAM (HBM3 DRAM) a double data rate 5 (DDR5) device or a low power DDR5 (LPDDR5) device (e.g., a mobile DDR device). In some examples, the memory device 106 may include a second interface circuit 108. In examples wherein the memory device 106 is an HBM device (e.g., HBM DRAM device), the first and second interface circuits 104 can be an HBM interface circuit. In examples wherein the memory device 106 is implemented as stacked ICs (e.g., 3-D stacked DRAM dies), an optional base HBM controller die may be employed and include the second interface circuit 108. In some examples, wherein the memory device 106 is implemented as the stacked ICs, each stacked IC can include a respective data interface circuit similar to the second interface circuit 108 to communicate with a respective first data interface circuit and thus the host device 102.

Figure 5:
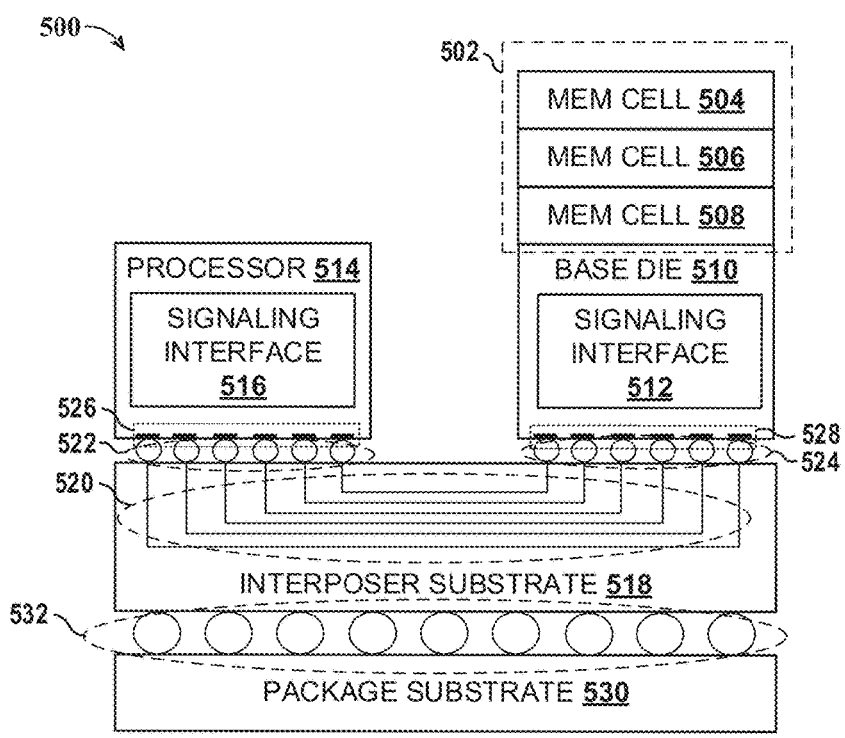
FIG. 5 is an example of an HBM memory system.

The first and second interface circuits 104 and 108 can be configured to communicate data using a communication channel 110. The communication channel 110 can be representative of a trace, a wire, or any type of conductive path over which the data between the first and second interface circuits 104 and 108 can be communicated. Thus, the communication channel 110 can be a signal path over which a data signal can be communicated from the first interface circuit 104 to the second interface circuit 108. For clarity and brevity purposes, the example of FIG. 1 illustrates a single communication channel, however, in other examples there can be any number of communication channels for sending and receiving signals between the first and second interface circuits 104 and 108 (or respective instances of said interface circuits). In some examples, the communication channel 110 is an interposer channel of an HBM memory system (e.g., the HBM memory system 500, as shown in FIG. 5). By way of further example, the communication channel 110 can be representative of a single communication channel of a grouping of communication channels that can define a data bus between the first and second interface circuits 104 and 108. In some examples, the data bus can include bidirectional communication channels, wherein one of the bidirectional communication channels is the communication channel 110.

As shown in FIG. 1, the first interface circuit 104 can include a transmitter circuit 112, and the second interface circuit 108 can include a receiver circuit 114. For clarity and brevity purposes other components of the first and second interface circuits 104 and 108 have been omitted (e.g., a sampling circuit, a logic determination circuit, power supply circuitry, etc.). In some examples, the first and second interface circuits 104 and 108 can include a respective transceiver. The transceiver of the first interface circuit 104 can include the transmitter circuit 112, and the transceiver of the second interface circuit 108 can include the receiver circuit 114.

The first interface circuit 104 can include a first input node 116. The term "node" as used herein can refer to a pin, a pad, or any type of conductive interface at which a signal can be received. The host device 102 can be configured to provide data, which the transmitter circuit 112 can process for communication over the communication channel 110 to the receiver circuit 114. The data provided by the host device 102 can be provided as a signal that includes symbols that can represent first and second logic states, such as a one (1) and a zero (0). The term "first logical state" as used herein can refer to a signal having a high value for a duration of time. In contrast, the term "second logical state" as used herein can refer to a signal have a logical low value for a duration of time.

The transmitter circuit 112 can be configured to place the symbols on the communication channel 110 and the receiver circuit 114 can be configured to detect a sequence of symbols in order to reconstruct transmitted data. The first input node 116 can be configured to receive an input signal 118 that includes a respective symbol and can be representative of the data to be transmitted by the transmitter circuit 112 to the receiver circuit 114. The transmitter circuit 112 can include a main driver circuit 120. A first input of the main driver circuit 120 can be coupled to the first input node 116 to receive the input signal 118. The main driver circuit 120 can be configured to generate a data signal 122 that includes the respective symbol based on the input signal 118.

For example, the main driver circuit 120 can be configured to generate the data signal 122 in a logical state representative of the respective symbol. The main driver circuit 120 can be configured to provide the data signal 122 at an output node 124 of the first interface circuit 104. An output of the main driver circuit 120 can be coupled to the output node 124. In some examples, during a first period of time, the main driver circuit 120 can be configured to generate the data signal 122 in a first logical state. In some examples, during a second period of time, the main driver circuit 120 can be configured to generate the data signal 122 in a second logical state.

In some examples, the main driver circuit 120 can include a main input drive circuit 126 and an output driver circuit 128. The main input drive circuit 126 can be configured to generate main driver signals 130 for driving the output driver circuit 128 based on the input signal 118. The output driver circuit 128 can be configured to generate the data signal 122 based on the main driver signals 130. In some examples, the main input drive circuit 126 can be operated in a first voltage domain and the output driver circuit 128 can be operated in a second voltage domain. The term "voltage domain" as used herein can refer to an operating voltage used for powering circuitry and/or generating a signal. The main input drive circuit 126 can be configured to receive a first voltage from a first voltage source circuit.

The main input drive circuit 126 can be configured to generate the main driver signals 130 based on the first voltage. The main input drive circuit 126 can generate the main driver signals 130 in a first logical state (e.g., in a logical high state) having an amplitude that is based on the first voltage. The output driver circuit 128 can be configured to receive a second voltage from a second voltage source circuit. The first voltage can be different from the second voltage, in some examples. In some examples, the output driver circuit 128 includes a first set of transistors. The first set of transistors can be selectively driven via a corresponding main gate driver signal to generate the data signal 122 based on the second voltage.

As shown in FIG. 1, the output node 124 can be coupled to the communication channel 110, which can be coupled to a second input node 132 of the memory device 106. In some examples, the second interface circuit 108 includes the second input node 132. Because the communication channel 110 is conductive, the communication channel 110 can impact a voltage slew rate of the data signal 122 at the second input node 132 of the memory device 106. This is because as electrical charges representing the data signal 122 travel (or flow) down the communication channel 110 away from the first interface circuit 104 toward the second interface circuit 108, channel effects (e.g., resistive and capacitive effects) of the communication channel 110 resist the flow of the electrical charges. If a channel length of the communication channel 110 is of a given channel length (e.g., nine (9) millimeters (mm) or longer), the channel effects of the communication channel 110 can reduce the voltage slew rate of the data signal 122 at the second input node 132.

Thus, the channel effects of the communication channel 110 can reduce a rate at which the electrical charges arrive at the second input node 132 corresponding to a reduction in the voltage slew rate of the data signal 122 at the second input node 132. Reducing the voltage slew rate of the data signal 122 reduces a rate at which an amplitude of the data signal 122 can change over time at the second input node 132. If the voltage slew rate of the data signal 122 is reduced at the second input node 132 by the channel effects of the communication channel 110, a respective edge of the data signal 122 at the second input node 132 can have a reduced signal transition rate (e.g., different from an ideal signal transition rate). The respective edge of the data signal 122 can transition at a reduced signal transition rate in contrast to a boosted data signal, as described herein. Because the respective edge of the data signal 122 transitions at the reduced signal transition rate a greater amount of time is needed for the respective edges to transition from a lower voltage state to a higher voltage state or from the higher voltage stage to the lower voltage state. The reduced signal transition rate reduces a width of the data signal 122, which can introduce sampling errors during data signal sampling.

In some examples, as described herein, the data signal 122 can be boosted at the output node 124 by the transmitter circuit 112 to provide a boosted data signal 134. The boosted data signal 134 can be provided via the communication channel 110 to the second input node 132. By boosting the data signal 122 at the output node 124 to provide the boosted data signal 134, the boosted data signal 134 at the second input node 132 can have a greater signal transition rate corresponding to a greater voltage slew rate in contrast to a non-boosted data signal received at the second input node 132. Thus, a respective edge (e.g., a rising edge) of the boosted data signal 134 can transition at a greater signal transition rate in contrast to a respective edge of the non-boosted data signal. Because the respective edge of the boosted data signal 134 transitions at a greater signal transition rate reduces sampling errors during data signal sampling.

For example, to boost the data signal 122 at the output node 124 to provide the boosted data signal 134, the transmitter circuit 112 includes a signal transition boosting circuit 136. The signal transition boosting circuit 136 can include a boost driver circuit 138 and a boost delay circuit 140. An output of the boost driver circuit 138 can be coupled to the output node 124. The boost driver circuit 138 can be configured to output a boosting signal 142 to the output node 124 based on a boost timing signal 144 provided by the boost delay circuit 140. An output of the boost delay circuit 140 can be coupled to a first input of the boost driver circuit 138 to receive the boost timing signal 144.

The boost timing signal 144 can be used to control a timing of signal boosting of the data signal 122 at the output node 124 to provide the boosted data signal 134. The term "signal boosting" and its derivatives (e.g., boost) as used herein can refer to increasing a signal transition rate of a signal during a period of time and/or an amplitude of the signal during the period of time. Thus, the boost timing signal 144 can be used to control when the boosting signal 142 is provided to the output node 124 to signal boost the data signal 122 to provide the boosted data signal 134. The boost timing signal 144 can have a logical high value during a first period of time that can be referred to herein as a first boosting period of time and a logical low value during a second period of time that can be referred to herein as a second boosting period of time.

In some examples, the first boosting period of time overlaps with a portion of time of the first period of time during which the main driver circuit 120 provides the data signal 122 in the first logical state. In some examples, the second boosting period of time overlaps with a portion of time of the second period of time during which the main driver circuit 120 provides the data signal 122 in the second logical state. By way of further example, during the first period of time, the boosting signal 142 can be provided to the output node 124 and combined with the data signal 122 in the first logical state being provided by the main driver circuit 120 to provide the boosted data signal 134 in the first logical state. The boosting signal 142 can have a logical high value during the first boosting period of time and a logical low value during the second boosting period of time.

For example, during the first boosting period of time, the boost driver circuit 138 can be configured to provide (e.g., pump) electrical charge to the output node 124 to combine with electrical charge representative of a signal transition portion of the data signal 122 being provided by the main driver circuit 120. Because the additional electrical charge is being provided to the output node 124 by the boost driver circuit 138 during the portion that the first boosting period of time and the first period of time overlap, the boosted data signal 134 can have an increased signal transition rate at the output node 124 in contrast to the non-boosted data signal.

In some examples, the data signal 122 in the first logical state at the output node 124 can be modified during the first period of time by the boost driver circuit 138 based on the boost timing signal 144 to provide the boosted data signal 134 in the first logical state. For example, the additional electrical charge being provided by the boost driver circuit 138 can cause the amplitude of the data signal 122 in the first logical state to increase above a first voltage reference during the first boosting period of time to provide the boosted data signal 134. In some examples, the first voltage reference can represent a first amplitude of the second voltage that is provided to the output driver circuit 128 to generate the data signal 122 in the first logical state.

In some examples, the data signal 122 in the second logical state can be modified during the second period of time by the boost driver circuit 138 based on the boost timing signal 144 to provide the boosted data signal 134 in the second logical state. For example, the additional electrical charge being provided by the boost driver circuit 138 can cause the amplitude of the data signal 122 in the second logical state to decrease below a second voltage reference during the second period of time. The second voltage reference can represent a second amplitude of the second voltage that is provided to the output driver circuit 128 to generate the data signal 122 in the second logical state. In some examples, the amplitude of second voltage is zero (0).

By way of further example, during the first boosting period of time, the boost driver circuit 138 can be configured to positive boost (e.g., increase an amplitude of) the data signal 122 in the first logical state to about a third voltage reference that is greater than the first voltage reference to provide the boosted data signal 134 in the first logical state. In some examples, during the second boosting period of time, the boost driver circuit 138 can be configured to negative boost (e.g., decrease an amplitude of) the data signal 122 in the second logical state from the second voltage reference to a fourth voltage reference to provide the boosted data signal 134 in the second logical state. The fourth voltage reference can be less than the second voltage reference.

By way of further example, during the second period of time, the boosting signal 142 can be provided to the output node 124 and combined with the data signal 122 in the second logical state being provided by the main driver circuit 120 to provide the boosted data signal 134 in the second logical state. During the second boosting period of time, the boost driver circuit 138 can be configured to provide the additional electrical charge to the output node 124 and combined with the electrical charge being provided by the main driver circuit 120 to provide the boosted data signal 134. Because the additional electrical charge is being provided to the output node 124 by the boost driver circuit 138 during a respective boosting period of time, the boosted data signal 134 generated at the output node 124 can have an increased signal transition rate in contrast to the non-boosted data signal.

Because the boosted data signal 134 in the first or second logical state has an increased signal transition rate in contrast to the non-boosted data signal, the boosted data signal 134 can have a greater voltage slew rate at the second input node 132. This is because the amplitude of the boosted data signal 134 at the second input node 132 can change at a greater voltage rate than an amplitude of the non-boosted data signal as a rate that electrical charge arrives at the second input node 132 of the memory device 106 has been increased by the boosting signal 142.

By way of further example, the boost driver circuit 138 includes a boost input drive circuit 146 and a boost driver circuit 148. In some examples, the boost input drive circuit 146 can be operated in the first voltage domain. The boost input drive circuit 146 can be configured to generate boost driver signals 150 for driving the boost driver circuit 148 based on the boost timing signal 144. The boost driver circuit 148 can be configured to generate the boosting signal 142 based on the boost driver signals 150. The boost driver circuit 148 can be configured to receive the first voltage for generating the boosting signal 142. The boost driver circuit 148 can include a second set of transistors. The second set of transistors can be selectively driven by a corresponding boost gate driver signal to generate the boosting signal 142 in a respective logical state based on the second voltage.

For example, the corresponding boost gate driver signal can have a logical high value during the first boosting period of time that the boost timing signal 144 has the logical high value, and a logical low value during the second boosting period of time that the boost timing signal 144 has the logical low value to provide the boosting signal 142 in a corresponding logical state. Thus, in some examples, the boost driver circuit 148 can be configured to provide the boosting signal 142 having the logical high value during the period of time that the first boosting period of time overlaps with the portion of time of the first period of time. In further examples, the boost driver circuit 148 can be configured to provide the boosting signal 142 having the logical low value during the period of time that the second boosting period of time overlaps with the portion of time of the second period of time.

In some examples, the main driver circuit 120 and the boost driver circuit 138 can be configured to receive an output enable signal 152. The output enable signal 152 can be used to enable data traffic between the transmitter circuit 112 and the receive circuit 114. In some examples, the output enable signal 152 can be toggled during read to write state change. A second input of the main driver circuit 120 and a second input of the boost driver circuit 138 can be coupled to a third input node 154. In some examples, the host device 102 can be configured to provide the output enable signal 152 at the third input node 154. The output enable signal 152 can be provided to the main driver circuit 120 to cause the main driver circuit 120 to provide the data signal 122 to the output node 124. Thus, the main driver circuit 120 can be configured to provide the data signal 122 based on the output enable signal 152.

The output enable signal 152 can be provided to the boost driver circuit 138 to cause the boost driver circuit 138 to provide the boosting signal 142 to the output node 124. Thus, the boost driver circuit 138 can be configured to provide the boosting signal 142 based on the output enable signal 152. In some examples, the boost driver circuit 138 can be configured to receive a boost enable signal 156. The boost enable signal 156 can be provided to the boost driver circuit 138 to enable operations of the boost driver circuit 138. Thus, the boost driver circuit 138 can be configured to provide the boosting signal 142 based on the boost enable signal 156 and the output enable signal 152. A third input of the boost driver circuit 138 can be coupled to a fourth input node 158. In some examples, the host device 102 can be configured to provide the boost enable signal 156 at the fourth input node 158.

As described herein, the boost delay circuit 140 is configured to generate the boost timing signal 144. The boost delay circuit 140 can be configured to generate the boost timing signal 144 based on the input signal 118, the boost enable signal 156, output enable signal 152, and a charge pump delay adjustment signal 160. The charge pump delay adjustment signal 160 can specify or define the time delay when the boost driver circuit 138 is to pump the electrical charges to the output node 124. Thus, the charge pump delay adjustment signal 160 can specify the time delay when the boost timing signal 144 is in the first logical state or the second logical state. As such, the charge pump delay adjustment signal 160 can define or set time delay for the first boosting period of time and/or the second boosting period of time. The time delay at which the boost driver circuit 138 is to pump the electrical charges to the output node 124 can be determined during a training phase of the transmitter circuit 112. For example, a training algorithm can be implemented as a combination of logic and circuitry and can be employed to determine the time delay when the boost driver circuit 138 is to pump the electrical charges to the output node 124 for signal boosting of the data signal 122 to provide the boosted data signal 134.

As shown in FIG. 1, a first input of the boost delay circuit 140 can be coupled to the first input node 116 to receive the input signal 118. A second input of the boost delay circuit 140 can be coupled to the fourth input node 158 to receive the boost enable signal 156. A third input of the boost delay circuit 140 can be coupled to a fifth input node 162 to receive the charge pump delay adjustment signal 160. In some examples, the host device 102 can be configured to provide the charge pump delay adjustment signal 160 to the fifth input node 162. In some examples, the host device 102 includes circuitry and/or a controller for generating signals 152, 156, and/or 160. In other examples, a controller external to the host device 102 may be used to provide the signals 152, 156, and/or 160. In some examples, a controller of the first interface circuit 104 can be configured (e.g., programmed) to provide the signals 152, 156, and/or 160.

Accordingly, the transmitter circuit 112 can boost the data signal 122 at the output node 124 by pumping additional electrical charges to the output node 124 via the boosting signal 142 to provide the boosted data signal 134. By boosting the data signal 122 at the output node 124, the boosted data signal 134 can have a greater signal transition rate corresponding to a greater voltage slew rate at the second input node 132 in contrast to the non-boosted data signal. Thus, the respective edge of the boosted data signal 134 can transition at a greater signal transition rate at the second node 132 in contrast to the non-boosted data signal. Because the respective edge of the boosted data signal 134 transitions at a higher rate than the respective edge of the non-boosted data signal the eye width and eye height of the eye diagram for the receiver circuit 114 can be improved (e.g., widened), thereby reducing or minimizing errors being introduced during sampling of the boosted data signal 134 at the memory device 106.

Figure 2:
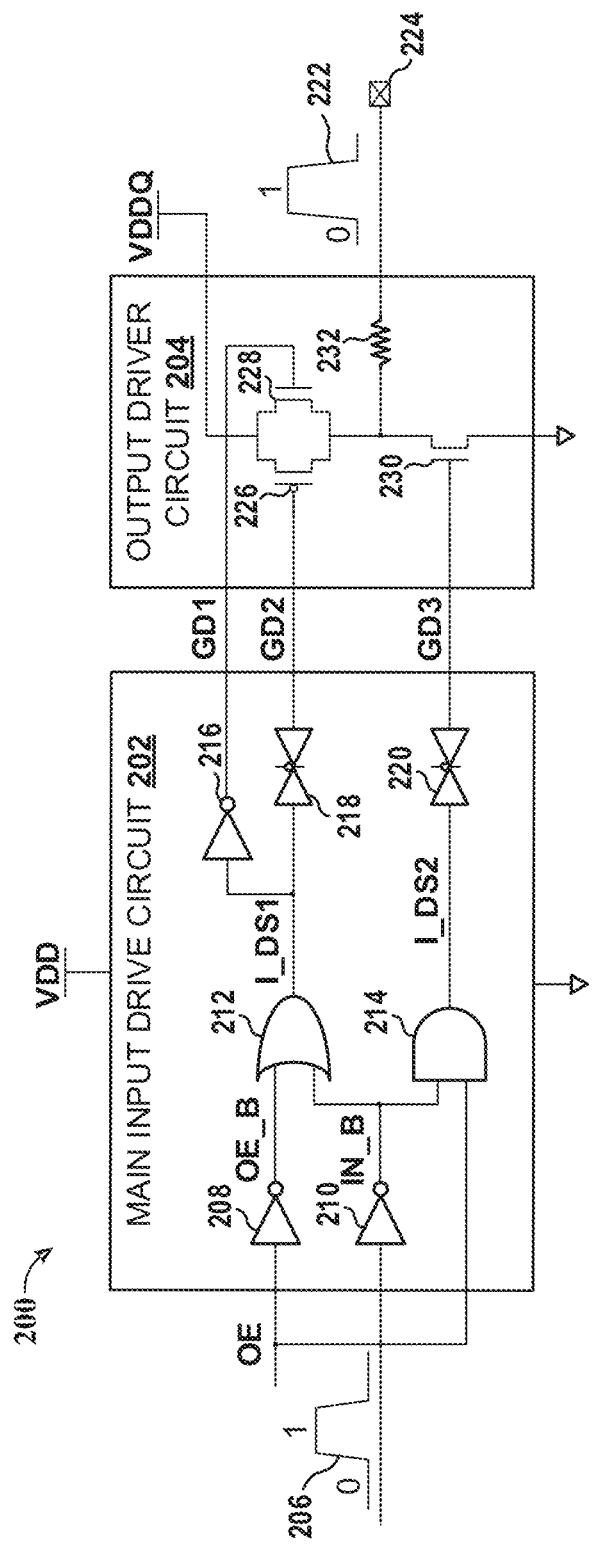
FIG. 2 is an example of a main driver circuit.

FIG. 2 is an example of a main driver circuit 200. The main driver circuit 200 can be the main driver circuit 120, as shown in FIG. 1. Thus, in some examples, reference can be to FIG. 1 in the example of FIG. 2. The main driver circuit 200 can include a main input drive circuit 202 and an output driver circuit 204. In some examples, the main input drive circuit 202 can be the main input drive circuit 126 and the output driver circuit 204 can be the output driver circuit 128, as shown in FIG. 1. The main input drive circuit 202 can be configured to receive an input signal 206, which can correspond to the input signal 118, as shown in FIG. 1. In some examples, a sequence of bits (e.g., 1's and 0's) can be provided to the main input drive circuit 202 and can be represented by the input signal 206. Thus, the input signal 206 can have a first logical state during a first period of time to represent a first value (e.g., a logical zero (0), as shown in FIG. 2), and a second logical state during a second period of time to represent a second value (e.g., a logical one (1), as shown in FIG. 2).

In some examples, the main input drive circuit 202 can be powered by a first voltage source circuit VDD. In some examples, the first voltage source circuit VDD is a direct current (DC) voltage source circuit. The first voltage source circuit VDD can be configured to provide a first voltage to the main input driver circuit 202 to enable the main input drive circuit 202 to generate first, second, and third main gate driver signals GD1, GD2, and GD3. The first, second, and third main gate driver signals GD1, GD2, and GD3 can correspond to one of the main driver signals 130, as shown in FIG. 1. By way of example, the first voltage source circuit VDD can be configured to provide the first voltage to the main input drive circuit 202 that is in a voltage range of about 0.675V to about 0.825V.

In some examples, the main input drive circuit 202 can include a first inverter 208 and a second inverter 210. The first inverter 208 can be configured to receive an output enable signal OE. The output enable signal OE can be the output enable signal 152, as shown in FIG. 1. The first inverter 208 can be configured to invert the output enable signal OE to provide an inverted output enable signal OE_B. The second inverter 210 can be configured to receive the input signal 206 and invert the input signal to provide an inverted input signal IN_B.

In some examples, the main input drive circuit 202 includes an OR gate 212 and an AND gate 214. The OR gate 212 can be configured to receive the inverted output enable signal OE_B and the inverted input signal IN_B. The OR gate 212 can be configured to output a first intermediate driver signal I_DS1 based on the inverted output enable signal OE_B and the inverted input signal IN_B. The AND gate 214 can be configured to receive the inverted input signal IN_B and the output enable signal OE. The AND gate 214 can be configured to output a second intermediate driver signal I_DS2 based on the inverted input signal IN_B and the output enable signal OE.

In some examples, the main input drive circuit 202 includes a third inverter 216. The third inverter 216 can be configured to receive the first intermediate driver signal I_DS1 and invert the first intermediate driver signal I_DS1 to provide an inverted first intermediate driver signal as the first main gate driver signal GD1. In some examples, the main input drive circuit 202 includes a first transmission gate 218 and a second transmission gate 220. The first transmission 218 can be configured to provide the first intermediate driver signal I_DS1 as the second main gate driver signal GD2. The second transmission gate 220 can be configured to provide the second intermediate driver signal as the third main gate driver signal GD3. Each of the first, second, and third main gate driver signals GD1, GD2, and GD3 can be provided to the output driver circuit 204 for driving a corresponding field effect transistor (FET) to generate a data signal 222 at an output node 224. In some examples, the data signal 222 is the data signal 122, and the output node 224 is the output node 124, as shown in FIG. 1. While the example of FIG. 2 illustrates the main driver circuit 200 including the output node 224, in other examples the output node 224 can be external to the main driver circuit 200, and the main driver circuit 200 can be coupled to the output node 224 (e.g., such as shown in FIG. 1).

In some examples, the output driver circuit 204 can be supplied by a second voltage generated by a second voltage source circuit VDDQ. In some examples, the second voltage source circuit VDDQ is a DC voltage source circuit. The second voltage source circuit VDDQ can be configured to supply the second voltage to the output driver circuit 204 for the generation of the data signal 222. By way of example, the second voltage source circuit VDDQ can be configured to provide the second voltage that is in a voltage range of about 0.36V to about 0.44V.

In some examples, the output driver circuit 204 can include a first FET 226, a second FET 228, and a third FET 230. In some examples, the first FET 226 can be a p-type metal-oxide-semiconductor (MOSFET), and the second and third FETS 228 and 230 can be n-type MOSFETs. Because the first FET 226 is a p-type MOSFET and the second FET 228 is an n-type MOSFET, the first and second FETS 226 and 228 can define or form a hybrid pull-up circuit. The first and second FETs 226 and 228 can be coupled to the second voltage circuit VDDQ to receive the second voltage. For example, a source of the first FET 226 and a drain of the second FET 228 can be coupled to the second voltage circuit VDDQ to receive the second voltage.

By way of further example, a gate of the first FET 226 can be coupled to an output of the third inverter 216 to receive the first main gate driver signal GD1. A gate of the second FET 228 can be coupled to an output of the first transmission gate 218 to receive the second main gate driver signal GD2. A gate of the third FET 230 can be coupled to an output of the second transmission gate 220 to receive the third main gate driver signal GD3. As shown in FIG. 2, a drain of the first FET 226 and a source of the second FET 228 can be coupled to a drain of the third FET 230. The source of the third FET 230 can be coupled to a ground. The output driver circuit can include a resistor 232. In some examples, during operation of the main driver circuit 200, the first, second, and third FETs 226, 228 and 230 can be driven based on a respective one of the first, second, and third main driver signals GD1, GD2, and GD3 to provide the data signal 222 across the resistor 232. The data signal 222 can have a first logical state during a third period of time to represent a first value (e.g., a logical zero (0), as shown in FIG. 2), and a second logical state during a third period of time to represent a second value (e.g., a logical one (1), as shown in FIG. 2). As described herein, the data signal 222 can be combined with the boosting signal 142 to provide the boosting data signal 134.

Figure 3:
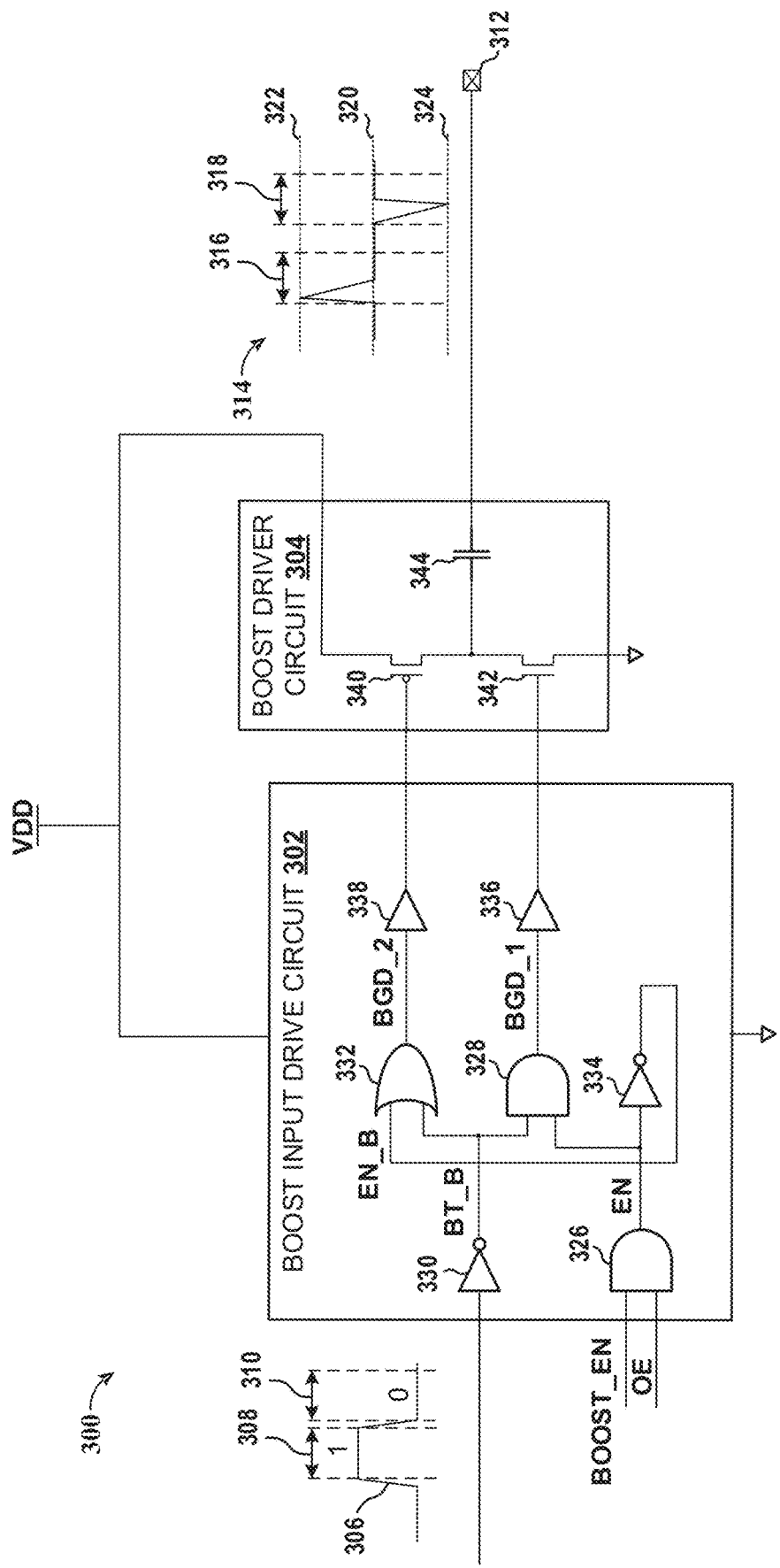
FIG. 3 is an example of a boost driver circuit.

FIG. 3 is an example of a boost driver circuit 300. In some examples, the boost driver circuit 300 can be the boost driver circuit 138, as shown in FIG. 1. Thus, in some examples, reference can be made to FIGS. 1-2 in the following example of FIG. 3. The boost driver circuit 300 can include a boost input drive circuit 302 and a boost driver circuit 304. In some examples, the boost input drive circuit 302 can be the boost input drive circuit 146, and the boost driver circuit 304 can be the boost driver circuit 148, as shown in FIG. 1. The boost input drive circuit 302 can be configured to receive a boost timing signal 306. The boost timing signal 306 can be the boost timing signal 144, as shown in FIG. 1.

The boost timing signal 306 can be provided by the boost delay circuit 140, as shown in FIG. 1. The boost timing signal 306 can be used to control the timing of signal boosting of the data signal 122, as shown in FIG. 1, or the data signal 222, as shown in FIG. 2. The boost timing signal 306 can have a logical high value (represented as logical one (1) in FIG. 3) during a first period of time 308 that can be referred to herein as a first boosting period of time 308 and a logical low value (represented as a logical zero (0) in FIG. 3) during a second period of time 310 that can be referred to herein as a second boosting period of time 310.

The boost driver circuit 300 can be configured to provide electrical charges at a given charge pump time to an output node 312 during each of the first and second boosting periods of time 308 and 310 to provide a boosting signal 314. In some examples, the output node 312 is the output node 124, as shown in FIG. 1, or the output node 224, as shown in FIG. 2. Thus, in some examples, the output node 312 can be configured to receive the data signal 122, as shown in FIG. 1, or the data signal 222, as shown in FIG. 2. While the example of FIG. 3 illustrates the boost driver circuit 300 including the output node 312, in other examples the output node 312 can be external to the boost driver circuit 300, and the boost driver circuit 300 can be coupled to the output node 312 (e.g., such as shown in FIG. 1).

For example, during a third period of time 316, the boost driver circuit 300 can provide the electrical charges to the output node 312 to generate the boosting signal 314. In some examples, the boosting period of time 316 can overlap with the logic 0 to 1 transition state of signal 222 shown in FIG. 2. The boost driver circuit 300 can be configured to output the boosting signal 314 with amplitude during the third period of time 316 that increases from about a first voltage reference 320 to about a second voltage reference 322 that is greater than the first voltage reference 320. A rate at which the amplitude of the boosting signal 314 increases from the first voltage reference 320 to about the second voltage reference 322 can be based on the given charge pumping rate. Thus, the given charge pumping rate can define or specify a signal transition rate of the boosting signal 314 during the third period of time 316.

In some examples, during a fourth period of time 318, the boost driver circuit 300 can provide electrical charges to the output node 312 to generate the boosting signal 314. In some examples, the boosting period of time 318 can overlap with logic 1 to 0 transition of signal 222 shown in FIG. 2. The boost driver circuit 300 can provide the boosting signal 314 with an amplitude during the fourth period of time 318 that decreases from about the first voltage reference 320 to about a third voltage reference 324 that is less than the first voltage reference 320. A rate at which the amplitude of the boosting signal 314 decreases from the first voltage reference 320 to about the third voltage reference 324 can be based on the given charge pumping rate. Thus, the given charge pumping rate can define or specify a signal transition rate of the boosting signal 314 during the fourth period of time 318.

In some examples, the boost driver circuit 300 can be configured to provide the electrical charges to the output node 312 in response to a boost enable signal BOOST_EN. The boost enable signal BOOST_EN can correspond to the boost enable signal 156, as shown in FIG. 1. In some examples, the boost input drive circuit 302 includes a first AND gate 326 that can be configured to receive the boost enable signal BOOST_EN. The first AND gate 326 can further be configured to receive an output enable signal OE. In some examples, the output enable signal OE is the output enable signal 152 as shown in FIG. 1. The first AND gate 326 can be configured to output an intermediate boost enable signal EN based on the boost enable signal BOOST_EN and the output enable signal OE.

In some examples, the boost input drive circuit 302 can include a second AND gate 328. The second AND gate 328 can be configured to receive the intermediate boost enable signal EN and an inverted boost timing signal BT_B. For example, the boost input drive circuit 302 can include a first inverter 330 that can be configured to receive and invert the boost timing signal 306 to provide the inverted boost timing signal BT_B. The second AND gate 328 can be configured to output a first boost gate driver signal BGD_1 based on the inverted boost timing signal BT_B and the intermediate boost enable signal EN.

In some examples, the boost input drive circuit 302 can include an OR gate 332 and a second inverter 334. The second inverter 334 can be configured to provide an inverted intermediate boost enable signal EN_B. As shown in FIG. 3, the inverted intermediate boost enable signal EN_B can be provided to the OR gate 332. The OR gate 332 can be configured to receive the intermediate boost enable signal EN_B and the inverted boost timing signal BT_B. The OR gate 332 can be configured to output a second boost gate driver signal BGD_2 based on the intermediate boost enable signal EN_B and the inverted boost timing signal BT_B. Each of the first and second boost gate driver signals BGD_1 and BGD_2 can be provided to respective first and second buffers 336 and 338, which can provide the first and second boost gate drivers signal to the boost driver circuit 304. The first and second boost gate driver signals BGD_1 and BGD_2 can correspond to one of the boost driver signals 150, as shown in FIG. 1.

In some examples, the boost driver circuit 304 can include a first FET 340 and a second FET 342. By way of example, the first FET 340 can be a p-type MOSFET, and the second FET 342 can be n-type MOSFET. A gate of the first FET 340 can be coupled to an output of the second buffer 338 and a gate of the second FET 342 can be coupled to an output of the first buffer 336. A source of the first FET 340 can be coupled to a voltage source circuit VDD, in some examples corresponding to the first voltage source circuit VDD, as shown in FIG. 2. A source of the second FET 342 can be coupled to a ground. A drain of the first FET 340 can be coupled to a drain of the second FET 342. The boost driver circuit 304 can include a capacitor 344 that can be coupled on a first side to the drains of the first and second FETs 340 and 342. A second side of the capacitor 344 can be coupled to the output node 312.

During an operation of the boost driver circuit 300, the first and second FETs 340 and 342 can be driven by a corresponding first and second boost gate driver signal BGD_1 and BGD_2. For example, during the first boosting period of time 308, the first FET 340 can be driven by the first boost gate driver signal BGD_1 to provide electrical charges based on a voltage provided by the voltage source circuit VDD to generate the boosting signal 314, as shown during the third period of time 316. In some examples, during the second boosting period of time 310, the second FET 342 can be driven by the second boost gate driver signal BGD_2 to provide electrical charges based on the voltage provided by the voltage source circuit VDD to generate the boosting signal 314, as shown during the fourth period of time 318. The rate at which the amplitude of the boosting signal 314 increases during the third period of time 316 or decreases during the fourth period of time 318 is based on the given charge pumping rate. The given charge pumping rate and thus the rate at which electrical charge is provided to the output node 312 can be based on a capacitance of the capacitor 344, a drive strength of the boost driver circuit 300, and the boost timing signal 306. As described herein, the data signal 122 or 222 can be combined with the boosting signal 314 to provide the boosted data signal 134, as shown in FIG. 1

Figure 4:
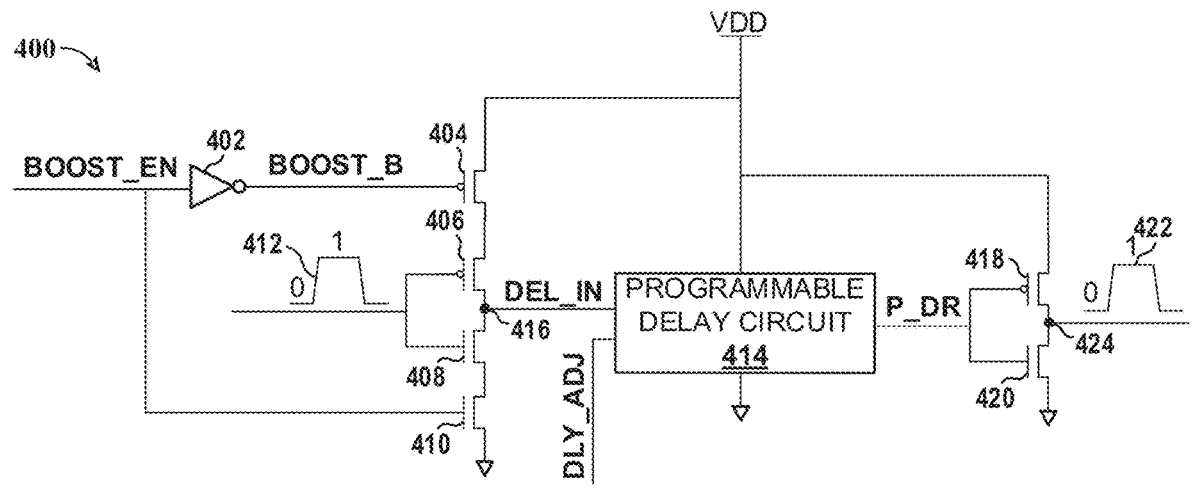
FIG. 4 is an example of a boost delay circuit.

FIG. 4 is an example of a boost delay circuit 400. In some examples, the boost delay circuit 400 can be the boost delay circuit 140, as shown in FIG. 1. Thus, in some examples, reference can be made to FIGS. 1-3 in the following example of FIG. 4. The boost delay circuit 400 can include a first inverter 402. The first inverter 402 can be configured to receive and invert a boost enable signal BOOST_EN to provide an inverted boost enable signal BOOST_B. The boost enable signal BOOST_EN can be the boost enable signal 156, as shown in FIG. 1, or the boost enable signal BOOST_EN, as shown in FIG. 3. The boost delay circuit 400 can include a first FET 404, a second FET 406, a third FET 408, and a fourth FET 410. The first and second FETs 404 and 406 can be p-type MOSFETs, and the third and fourth FETs 408 and 410 can be n-type MOSFETs. The first FET 404 can be coupled to a voltage source circuit VDD. The voltage source circuit VDD can be similar to the voltage source circuit VDD, as shown in FIGS. 2-3.

In some examples, a gate of the first FET 404 can be coupled to an output of the first inverter 402 to receive the inverted boost enable signal BOOST_B. Respective gates of the second and third FETs 406 and 408 can be configured to receive an input signal 412. In some examples, the input signal 412 is the input signal 118, as shown in FIG. 1, or the input signal 206, as shown in FIG. 2. In some examples, the input signal 412 can have a first logical state during a first period of time to represent a first value (e.g., a logical zero (0), as shown in FIG. 4), and a second logical state during a second period of time to represent a second value (e.g., a logical one (1), as shown in FIG. 4). In some examples, a gate of the fourth FET 410 can be configured to receive the boost enable signal BOOST_EN. As shown in FIG. 4, a drain of the first FET 404 can be coupled to a source of the second FET 406, and a drain of the second FET 406 can be coupled to a drain of the third FET 408 and to a programmable delay circuit 414. By way of further example, a drain of the fourth FET 410 can be coupled to a source of the third FET 408, and a source of the fourth FET 410 can be coupled to a ground.

In some examples, the gate of the first FET 404 can be configured to receive the inverse boost enable signal BOOST_B and the gate of the fourth FET 410 can be configured to receive the boost enable signal BOOST_EN. The gates of the second and third FETs 406 and 408 can be configured to receive the input signal 412. A current path can be established from the voltage source circuit or ground to output node 416 in response to the first, second, third, and fourth FETs 404, 406, 408, and 410 conducting based on a respective signal received at a corresponding gate. A delay input signal DEL_IN can be outputted at 416 based on a voltage provided by the voltage source circuit VDD responsive to the boost enable signal BOOST_EN and the input signal 412. For example, the delay input signal DEL_IN can be outputted as logic low (0) at 416 during the first period of time that the input signal 412 has a logical high value (e.g., a logical (1) value, as shown in FIG. 4). In some examples, during the second period of time that the input signal 412 has the logical low value (e.g., a logical zero (0), as shown in FIG. 4), the delay input signal DEL_IN is outputted as logic high (VDD) at 416.

In some examples, the boost delay circuit 400 includes the programmable delay circuit 414. The programmable delay circuit 414 can be configured to drive fifth and sixth FETs 418 and 420 to generate a boost timing signal 422 in response to the delay input signal DEL_IN. The boost timing signal 422 can be the boost timing signal 144, as shown in FIG. 1, or the boost timing signal 306, as shown in FIG. 3. The delay input signal DEL_IN can be provided to the programmable delay circuit 414 to control a timing of when the fifth and sixth FETs 418 and 420 are driven by the programmable delay circuit 414.

In some examples, the programmable delay circuit 414 can be configured to receive a charge pump delay adjustment signal DL_ADJ. The charge pump delay adjustment signal DLY_ADJ can be representative of a set of bits that can specify or define the amount of delay after which the boost driver circuit (e.g., the boost driver circuit 138, as shown in FIG. 1, or the boost driver circuit 300, as shown in FIG. 3) is to provide electrical charge to an output node (e.g., the output node 124, as shown in FIG. 1, or the output node 312, as shown in FIG. 3). Thus, the charge pump delay adjustment signal DLY_ADJ can specify an amount of time that a pump gate driver signal P_DR is to be in a logical high state (e.g., logical one (1)) to provide the boost timing signal 422.

Therefore, the charge pump delay adjustment signal DLY_ADJ can specify the delay of the pump gate driver signal P_DR that is to be used to drive the fifth and sixth FETs 418 and 420. The programmable delay circuit 414 can be configured to drive the fifth and sixth FETs 418 and 420 to generate the boost timing signal 422 in a logical high state based on the voltage level of the pump gate driver signal P_DR. The programmable delay circuit 414 can be configured to receive the voltage from the voltage source circuit VDD. The programmable delay circuit 414 can be configured to generate the pump gate driver signal P_DR based on the voltage provided by the voltage source circuit VDD.

In some examples, the fifth FET 418 is a p-type MOSFET, and the sixth FET 420 is an n-type MOSFET. Respective gates of the fifth and sixth FETs 418 and 420 can be coupled to an output of the programmable delay circuit 414 to receive the pump gate driver signal P_DR. In some examples, a source of the fifth FET 418 is coupled to the voltage source circuit VDD and a drain of the fifth FET 418 can be coupled to a drain of the sixth FET 410, which has a source coupled to the ground. The pump gate driver signal P_DR can be configured to drive the gates of the fifth and sixth FETs 418 and 420 to provide the boost timing signal 422 in respective logical states based on the voltage provided by the voltage source circuit. The boost timing signal 422 can have a first logical state during a third period of time to represent a first value (e.g., a zero (0), as shown in FIG. 4), and a second logical state during a fourth period of time to represent a second value (e.g., a logical one (1), as shown in FIG. 4).

In some examples, during an operation of the boost delay circuit 400, the gate of the first FET 404 and fourth FET 410 can be driven based on the boost enable signal BOOST_EN, and the input signal 412 in the first logical state e.g. (0) can be provided to drive the gates of the second and third FETS 406 and 408 to generate the delay input signal DEL_IN. The delay input signal DEL_IN can be provided to the programmable delay circuit 414. The programmable delay circuit 414 can be configured to adjust the timing delay of the signal P_DR going to the gate of the second FET 420 with the gate driver signal P_DR in the logical high state to generate the boost timing signal 422 in the first logical state (0). In some examples, the programmable delay circuit 414 can be configured to output the gate driver signal P_DR in a logical low state to generate the boost timing signal 422 in the second logical state which is logical high (e.g., a logical one (1)).

As described herein, the boost timing signal 422 can be provided to the boost driver circuit 138 or the boost driver circuit 300 to generate the boosting signal 142, as shown in FIG. 1, or the boosting signal 314, as shown in FIG. 3. The data signal 122, as shown in FIG. 1, or the data signal 222, as shown in FIG. 2, can be combined with the boosting signal 142 or 314 to provide the boosted data signal 134, as shown in FIG. 1.

FIG. 5 is an example of an HBM memory system 500. The HBM memory system 500 may be used in an electronic device, such as a computer, a tablet, a smartphone, a consumer appliance, printer, copier, camera, television, monitor, stereo, radio, radar, or any other electronic or computing device or system. In some examples, the high speed interface 100, as shown in FIG. 1, can correspond to the HBM memory system 500 interface. Thus, in some examples, reference can be made to FIGS. 1-4 in the following example of FIG. 5. The HBM memory system 500 can include an array 502 of memory cells 504, 506, and 508, and a base die (or buffer die) 510. While the example of FIG. 5 illustrates three memory cells, in other examples more than three memory cells can be employed. In some examples, the memory cells 504, 506, and 508 can be an example of a 2D or 3D memory cell. The memory cells 504, 506, and 508 and the base 510 can be coupled using one or more through-silicon vias (TSVs). The array 502 of memory cells 504, 506, and 508 may be an example of DRAM technology, Ferroelectric RAM (FeRAM) technology, or phase-change memory (PCM) technology. In some examples, the array 502 may be representative of a 3D IC chip stack. Thus, in some examples, each of memory cells 504, 506, and 508 may be IC memory chips.

The base 510 can be configured as an input/output (I/O) device for the array 502 of memory cells 504, 506, and 508. In some instances, the base 510 can be configured as a memory controller for the array 502 of memory cells 504, 506, and 508 accessing various memory cells using combinations of row decoders, column decoders, word lines, digit lines, other components, or combinations thereof. In some examples, the base 510 may be configured to buffer data communicated to and from the array 502 of memory cells 504, 506, and 508. The base 510 may include a first signaling interface 512 for communicating signals (e.g., such as the boosted data signal 134, as shown in FIG. 1) to and from a processor 514 of the HBM memory system 500. In some examples, the first signaling interface 512 may be the second interface circuit 108, as shown in FIG. 1. In some examples, the processor 514 may be an example of a GPU in a graphics device, a CPU, a FPGA chip, a parallel processing unit (PPU), or other logic device. In some examples, the processor 514 can be the host device 102, as shown in FIG. 1.

In some examples, the first signaling interface 512 can include the transmitter circuit 112, as shown in FIG. 1, for communication of the data signals to the processor 514. In other examples, the first signaling interface 512 can include a transceiver that includes the transmitter 112. By way of further example, the processor 514 can include a second signaling interface 516 for communicating signals (e.g., such as the data signals, described herein) to and from the base die 510. In some examples, the second signaling interface 516 can be the first interface circuit 104, as shown in FIG. 1. In some examples, the second signaling interface 516 can include the transmitter circuit 112 for communication of the data signals to the second signaling interface 516. In other examples, the second signaling interface 516 can include a transceiver that includes the transmitter 112. In some examples, the processor 514 can include a memory controller which can include the transmitter 112. In some examples, the second signaling interface can include a receiver circuit, such as the receiver circuit 114, as shown in FIG. 1.

As shown in FIG. 5, the processor 514 may be mounted onto an interposer substrate 518. The interposer substrate 518 can include communication channels (or interposer channels) 520 through which the data signals can be transmitted between respective first and second signaling interfaces 512 and 516. In some examples, one of the communication channels 520 can correspond to the communication channel 110, as shown in FIG. 1. The communication channels 520 may be independent of one another in some instances. In some examples, a portion of the communication channels 520 may be unidirectional channels and another portion of the communication channels 520 may be bidirectional channels.

The array 502 and/or the processor 514 can select different combinations or groups of the channels to communicate data (e.g., boosted data signals). In some examples, the processor 514 and the base die 510 (and thus the array 502) may be coupled to the interposer substrate 518 using respective bumps or pillars 522 and 524 (e.g., microbumps or pillars). Each bump 522 and 524 can be electrically coupled (e.g., soldered) to a respective electrical contact or pad 526 and 528, which can be coupled via an internal communication channel (not shown for clarity and brevity purposes) to a respective first and second signaling interface 512 and 516. In some examples, the output node 124, as shown in FIG. 1, can be a respective contact pad of the contact pads 526, and the second input node 132, as shown in FIG. 1, can be a respective contact pad of the contact pads 528. By way of further example, the interposer substrate 518 can be disposed on a package substrate 530. The package substrate 530 can also provide an electrical interface for routing input and output signals and power between the processor 514 and the array 502 of memory cells 504, 506, and 508, and electrical connections, which can provide electrical coupling to another substrate or printed circuit board (PCB).

In some examples, the communication channels 520 may be (conductive) traces or wires, thereby making each individual channel lossy. Because of channel characteristics, each channel 520 may behave as RC channel and can impact a voltage slew rate of data signals received at a far end of a respective channel. For example, if a data signal is transmitted from a respective pad of the pads 526 over a respective communication of the communication channels 520 to a respective pad of the pads 528, the far end of the respective channel can correspond to the respective pad of the pads 528. Because resistive-capacitive characteristics of the respective channel impact the slew rate of the data signal, the slew rate of the data signal at the far end of the respective channel can be limited. Thus, the slew rate of the data signal at the far end of the respective channel can be inversely proportional to a resistance and capacitance of the respective channel.

The decrease in voltage slew at the respective pad of the pads 526 that receives the data signal can lead to an eye mask time loss (e.g., an eye diagram for the receiver circuit of the first signaling interface 512 can be reduced), thereby limiting an interface speed (e.g., a rate at which data can be communicated between the first and second signaling interfaces 512 and 516). Resultantly, at high data rates (e.g., data rates at or above 5 gigabytes per second (Gbps)) an eye opening of the eye diagram for the receiver circuit for the respective channel can become reduced (e.g., smaller) and hence the eye mask time loss due to voltage slew rate can limit the rate at which data can be communicated over the respective channel between the first and second signaling interfaces 512 and 516. Moreover, increasing a drive strength does not improve the slew rate at the far end of the channel as the drive strength is limited by the resistance of the respective channel. Existing transmitter equalization techniques, such as pre-emphasis, de-emphasis, and time-domain feed-forward equalization do not provide sufficient slew rate improvement at the far end of the channel.

By employing the transmitter circuit 112 at the second signaling interface 516 (in other examples at the first signaling interface 512), the slew rate of the data signal at the far end of the channel can be boosted and thus reducing eye mask timing loss. Reducing the eye mask timing loss improves the eye diagram for the receiver circuit 114 at the first signaling interface 512 (or in other examples at the second signaling interface 516), and thus enables the receiver circuit 114 to accurately detect data encoded in the data signal. The transmitter circuit 112 can signal boost the data signal 122 to provide the boosted data signal 134, which allows for high data rate communications (e.g., at or above 5 Gbps). For example, the transmitter circuit 112 can be used in an LPDDR5 memory system to boost the data rate of the LPDDR5 memory system (e.g., from 6.4 Gbps to 8.5 Gbps). The transmitter circuit 112 can be used in any system where channel characteristics impact a slew rate of a data signal received at an input of a device or circuit. While examples are presented herein in which the transmitter circuit 112 is used memory interfaces (e.g., the first and second signaling interfaces 512 and/or 516), the transmitter circuit 112 may be used in other communication interfaces, such as a high-bandwidth interconnect (HBI) interface, an LPDDR5 interface, a chiplet interface, or a device-to-device (D2D).

Figure 6:
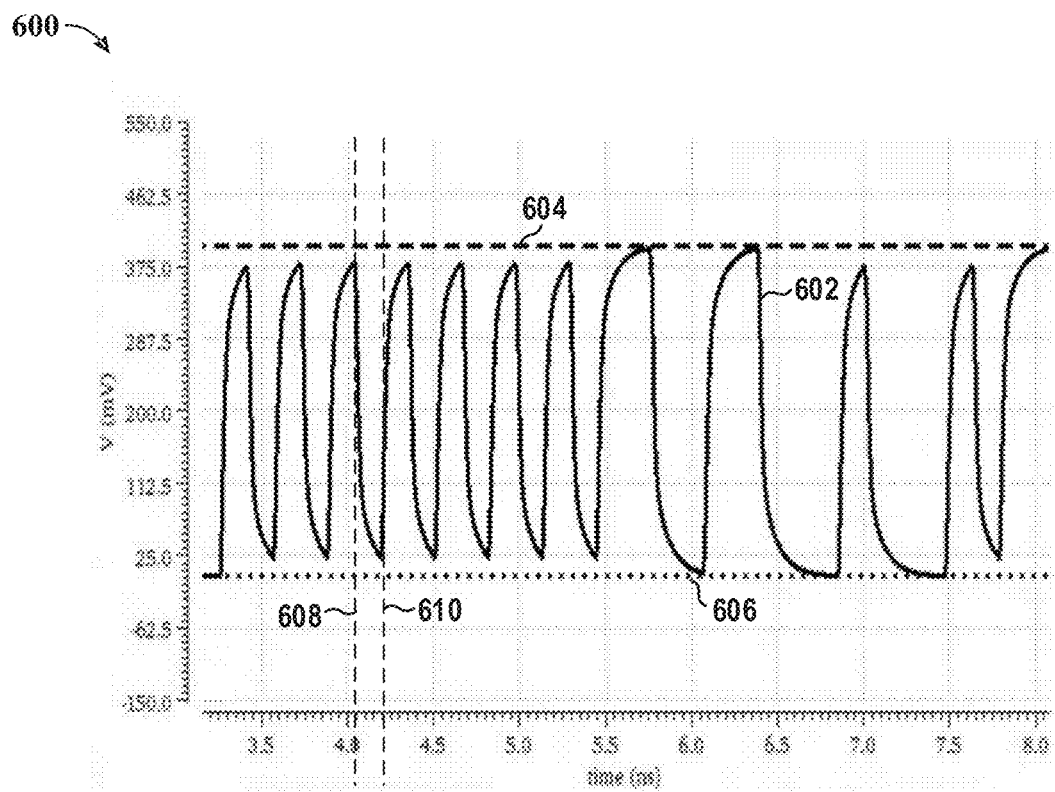
FIG. 6 is an example of a diagram illustrating a data signal generated by a non-signal boosting transmitter circuit at a near end.

FIG. 6 is an example of a diagram 600 illustrating a data signal 602 generated by a non-signal boosting transmitter circuit. A transmitter circuit that is configured without the signal transition boosting circuit 136, as shown in FIG. 1, can be referred to herein as a non-signal boosting transmitter circuit. In some examples, the non-signal boosting transmitter circuit can be implemented on an IC, such as a SoC, and the data signal 602 can be measured at an output node of the IC (e.g., at an output contact pad). As shown in the example of FIG. 6, a y-axis of the diagram 600 can represent a voltage in millivolts (mv) and an x-axis of the diagram 600 can represent time in nanoseconds (ns). The diagram 600 includes a first voltage reference 604 and a second voltage reference 606.

The first voltage reference 604 can be representative of a voltage amplitude (e.g., 360 mV) of a voltage provided by a voltage source circuit VDDQ. The second voltage reference 606 can be representative of a voltage amplitude (e.g., 0 mV) of the voltage provided by the ground voltage circuit. The voltage source circuit can be configured to provide the non-signal boosting transmitter circuit with the voltage. The non-signal boosting transmitter circuit can include a driver circuit that can be configured to generate the data signal based on the voltage provided by the voltage source circuit. As shown in the diagram 600, the data signal 602 can have a first voltage at a first instance of time 608 and a second voltage at second instance of time 610. For example, the first voltage at the first instance of time 608 can be 323 mV and the second voltage at the second instance of time 610 can be 39 mV. Thus, a voltage swing for the data signal 602 between the first instance of time 608 and the second instance of time 610 can be 284 mV (e.g., 323 mV–39 mV).

Figure 7:
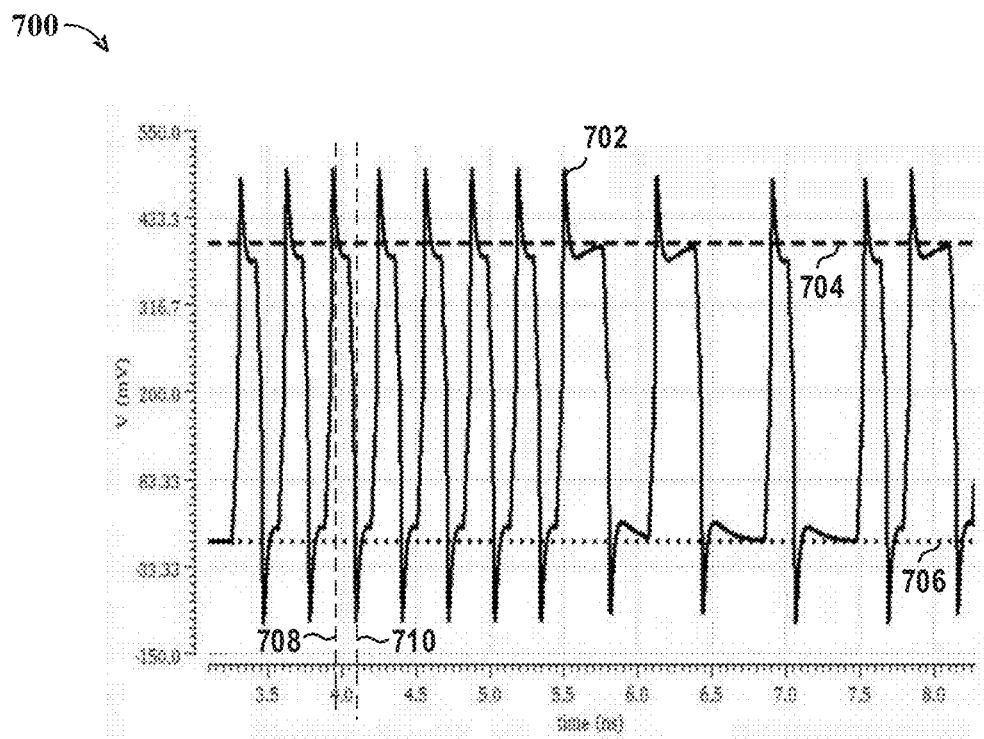
FIG. 7 is an example of a diagram illustrating a data signal generated by a signal boosting transmitter circuit at a near end.

FIG. 7 is an example of an diagram 700 illustrating a boosted data signal 702 generated by the transmitter circuit 112, as shown in FIG. 1. Thus, in some examples, reference can be to FIGS. 1-5 in the example of FIG. 7. In some examples, the boosted data signal 702 is the boosted data signal 134, as shown in FIG. 1. In some examples, the transmitter circuit 112 can be implemented on an IC, such as a SoC, and the boosted data signal 702 can be measured at an output of the IC (e.g., at the output node 124, as shown in FIG. 1). As shown in the example of FIG. 7, a y-axis of the diagram 700 can represent a voltage in mV and an x-axis of the diagram 700 can represent time in ns. The diagram 700 includes a first voltage reference 704 and a second voltage reference 706. The first voltage reference 704 can be representative of a voltage amplitude (e.g., 360 mV) of a voltage provided by a voltage source circuit, such as the voltage source circuit VDDQ, as shown in FIG. 2. The second voltage reference 706 can be representative of a voltage amplitude (e.g., 0 mV) of the voltage provided by the ground voltage circuit.

As shown in the diagram 700, the boosted data signal 702 can have a first voltage at a first instance of time 708 and a second voltage at a second instance of time 710. By way of example, the first voltage at the first instance of time 708 can be at about 431 mV and the second voltage at the second instance of time 710 can be at about –69 mV. In the example of FIG. 7, the boosted data signal 702 at the first and second instances of time 708 and 710 has been voltage boosted during signal generation by the transmitter circuit 112 above respective first and second voltage references 704 and 706. Thus, a voltage swing for the boosted data signal 702 between the first instance of time 708 and the second instance of time 710 can be about 500 mV (e.g., 431 mV–(–67) mV). Because in the example of FIG. 7 the boosted data signal 702 generated by the transmitter circuit 112 is boosted by the signal transition boosting circuit 136, as shown in FIG. 1, the boosted data signal 702 has a greater voltage swing in contrast to the data signal 602 generated by the non-signal boosting transmitter circuit.

Accordingly, the boosted data signal 702 provided by the transmitter circuit 112 can have an improved voltage swing in contrast to the data signal 602 provided by the non-signal boosting transmitter circuit. Moreover, as shown in FIG. 7, the boosted data signal 702 at instances in time, such as the first and second instances in time 708 and 710 has a voltage amplitude that is above or below the first and second voltage references 704 and 706, respectively. Because the non-signal boosting transmitter circuit does not employ the signal transition boosting circuit 136, the non-signal boosting transmitter circuit cannot boost the data signal 602 above or below the first and second and voltage references 704 and 706, thereby reducing a likelihood that a corresponding receiver circuit can determine correctly a digital value encoded in the data signal 602.

Figure 8:
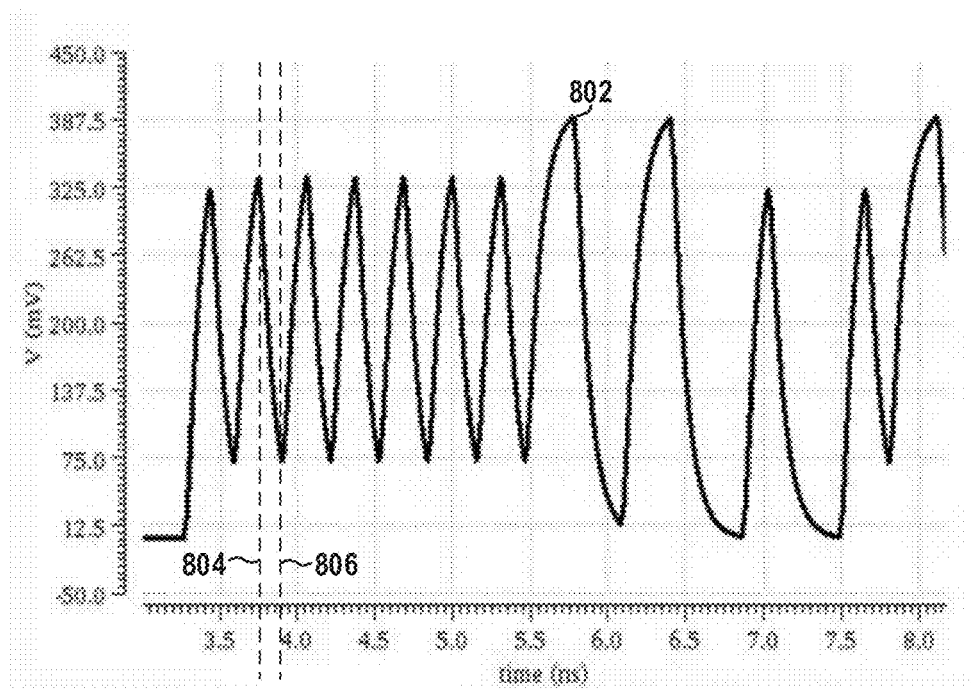
FIG. 8 is another example of a diagram illustrating a data signal generated by a non-signal boosting transmitter circuit at a far end.

FIG. 8 is another example of a diagram 800 illustrating a data signal 802 generated by a non-signal boosting transmitter circuit. In some examples, the non-signal boosting transmitter circuit can be implemented on an IC, such as a SoC, and the non-signal boosting transmitter circuit can be configured to provide the data signal 802 to an input node of a DRAM memory device (e.g., an HBM3 DRAM memory device). By way of example, the non-signal boosting transmitter circuit can be employed at a processor and can be coupled to an output node of the processor. An interposer channel can be employed to couple the output node of the processor to the input node of the DRAM memory device. A receiver circuit at the DRAM memory device can be coupled to the input node to receive the data signal 802 for processing (e.g., interpreting of encoded data in the data signal 802). FIG. 8 illustrates an example of the data signal 802 measured at the input node of the DRAM memory device (e.g., at a far end of the interposer channel).

As shown in the example of FIG. 8, a y-axis of the diagram 800 can represent a voltage in mV and an x-axis of the diagram 800 can represent time in ns. As shown in the diagram 800, the data signal 802 can have a first voltage at a first instance of time 804 and a second voltage at a second instance of time 806. For example, the first voltage at the first instance of time 804 can be 286 mV and the second voltage at the second instance of time 806 can be 72 mV. Thus, a voltage swing for the data signal 802 between the first instance of time 804 and the second instance of time 806 can be 214 mV (e.g., 286 mV–72 mV).

Figure 9:
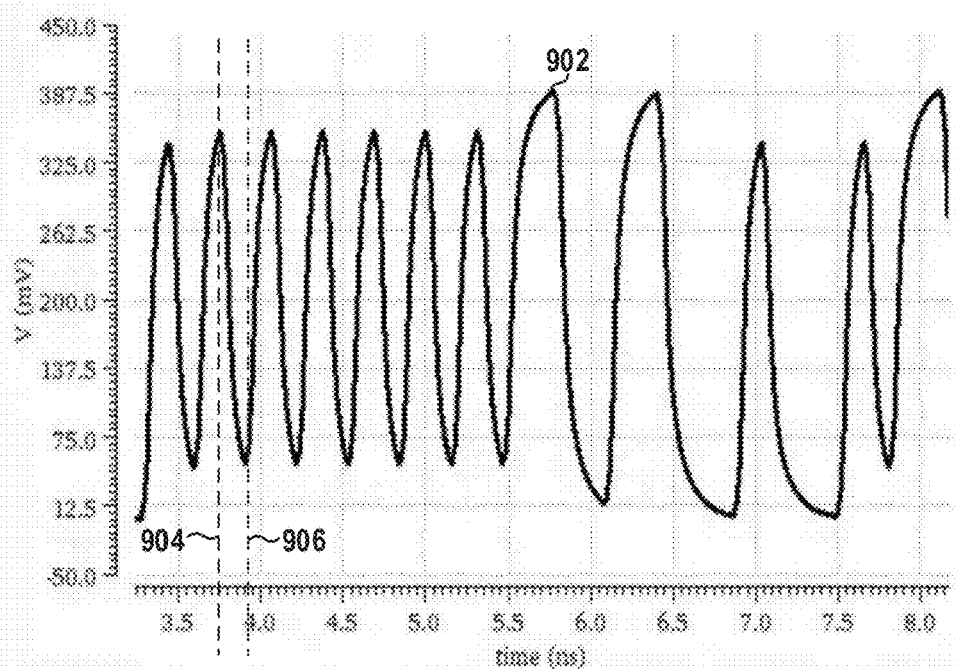
FIG. 9 is another example of a diagram illustrating a data signal generated by a signal boosting transmitter circuit at a far end.

FIG. 9 is another example of a diagram 900 illustrating a boosted data signal 902 generated by the transmitter circuit 112, as shown in FIG. 1. In some examples, the boosted data signal 902 can be the boosted data signal 134, as shown in FIG. 1. Thus, in some examples, reference can be to FIGS. 1-5 in the example of FIG. 9. In some examples, the transmitter circuit 112 can be implemented on an IC, such as a SoC, and the transmitter circuit 112 can be configured to provide the boosted data signal 902 to an output node (e.g. the output node 124, as shown in FIG. 1). The output node can be coupled via an interposer channel (e.g., the communication channel 110, as shown in FIG. 1) to an input node (e.g., the second input node 132, as shown in FIG. 1) of a DRAM memory device (e.g., an HBM3 DRAM memory device, in some examples, the memory device 106, as shown in FIG. 1). The DRAM memory device can include a receiver circuit (e.g., the receiver circuit 114, as shown in FIG. 1), which can be coupled to the input node to receive the boosted data signal 902 for processing (e.g., interpreting of encoded data in the boosted data signal 902). FIG. 9 illustrates an example of the boosted data signal 902 measured at the input node of the DRAM memory device (e.g., at a far end of the interposer channel).

As shown in the example of FIG. 9, a y-axis of the diagram 900 can represent a voltage in mV and an x-axis of the diagram 900 can represent time in ns. In some examples, the boosted data signal 902 can have a first voltage at a first instance of time 904 and a second voltage at a second instance of time 906. For example, the first voltage at the first instance of time 904 can be at about 331 mV and the second voltage at the second instance of time 906 can be at about 49 mV. Thus, a voltage swing for the boosted data signal 902 between the first instance of time 904 and the second instance of time 906 can be about 282 mV (e.g., 331 mV−49 mV). Thus, the boosted data signal 902 generated by the transmitter circuit 112 has a greater voltage swing in contrast to the data signal 802 generated by the non-signal boosting transmitter circuit. Accordingly, the boosted data signal 902 provided by the transmitter circuit 112 can have an improved voltage swing in contrast to the data signal 802 provided by the non-signal boosting transmitter circuit.

Figure 10:
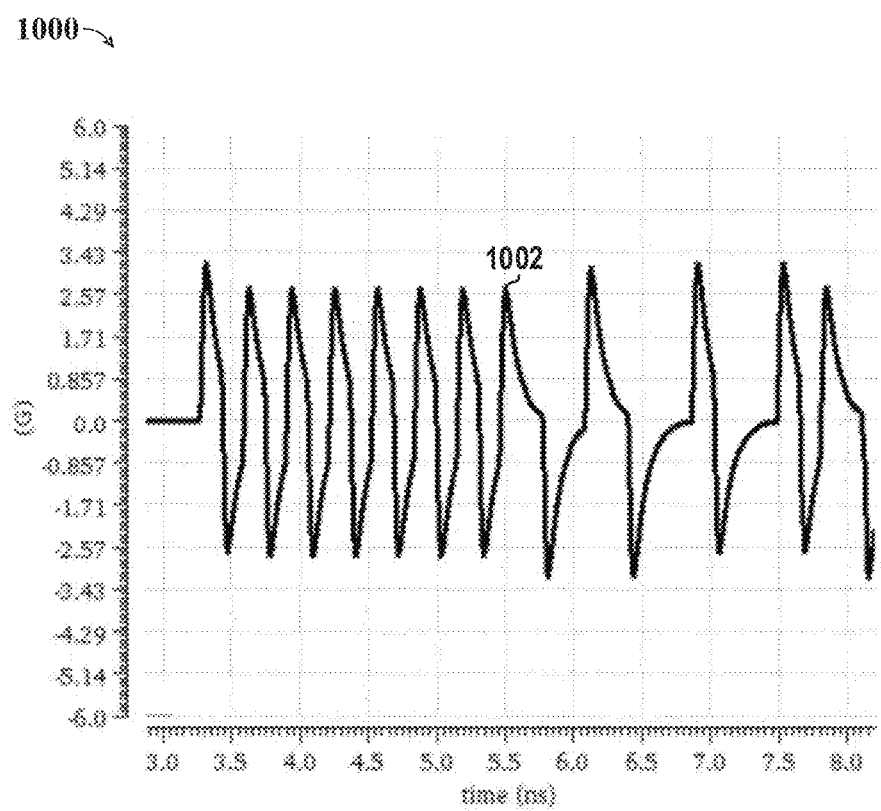
FIG. 10 is an example of a diagram illustrating a voltage slew rate of a data signal generated by a non-signal boosting transmitter circuit during a period of time.

FIG. 10 is an example of a diagram 1000 illustrating a voltage slew rate of a data signal 1002 over time generated by a non-signal boosting transmitter circuit. In some examples, the non-signal boosting transmitter circuit can be implemented on an IC, such as a SoC, and the non-signal boosting transmitter circuit can be configured to provide the data signal 1002 to an output node of the IC. The output node can be coupled via an interposer channel to the input node of a DRAM memory device (e.g., an HBM3 DRAM memory device). The DRAM memory device can include a receiver circuit that can be coupled to the input node to receive the data signal 1002 for processing (e.g., interpreting of encoded data in the data signal 1002). FIG. 10 illustrates an example of a voltage slew rate for the data signal 1002 at the input node of the DRAM memory device. As shown in the example of FIG. 10, a y-axis of the diagram 1000 can represent a slew rate in G (corresponding to a change in a voltage (e.g., measured in volts) over time (e.g., measured in ns)), and an x-axis of the diagram 1000 can represent time in ns.

Figure 11:
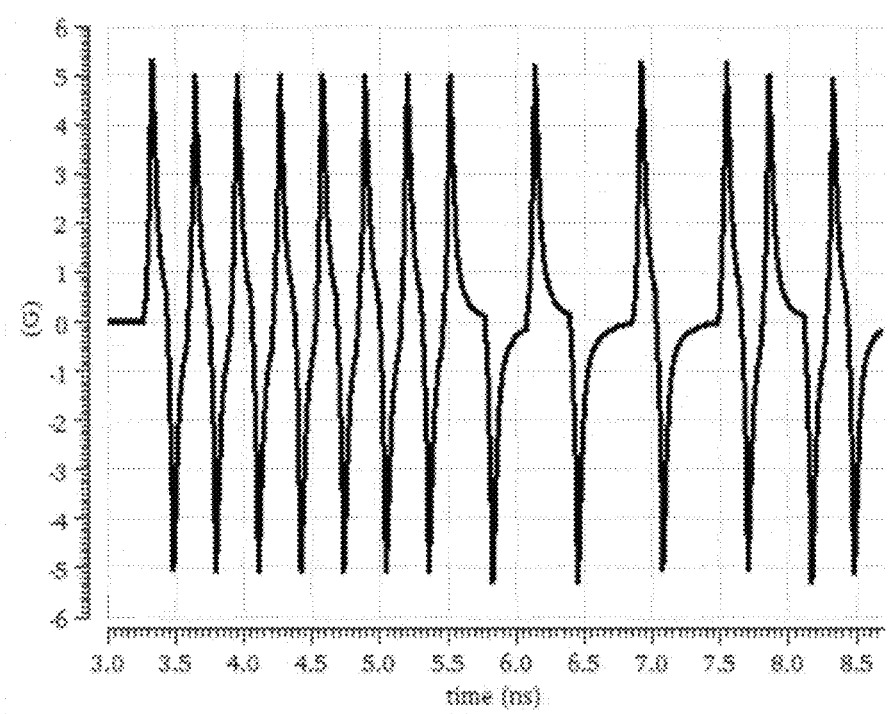
FIG. 11 is an example of a diagram illustrating a voltage slew rate of a boosted data signal generated by a signal boosting transmitter circuit during a period of time.

FIG. 11 is an example of a diagram 1100 illustrating a voltage slew rate of a boosted data signal 1102 over time generated by the transmitter circuit 112, as shown in FIG. 1. In some examples, the boosted data signal 1102 can be the boosted data signal 134, as shown in FIG. 1. Thus, in some examples, reference can be to FIGS. 1-5 in the example of FIG. 11. In some examples, the transmitter circuit 112 can be implemented on an IC, such as a SoC, and the transmitter circuit 112 can be configured to provide the boosted data signal 1102 to an output node (e.g., the output node 124, as shown in FIG. 1) of the IC. The output node can be coupled via an interposer channel (e.g., the communication channel 110, as shown in FIG. 1) to an input node (e.g., the second input node 132, as shown in FIG. 1) of a DRAM memory device (e.g., an HBM3 DRAM memory device, in some examples, the memory device 106, as shown in FIG. 1). The DRAM memory device can include a receiver circuit (e.g., the receiver circuit 114, as shown in FIG. 1) that can be coupled to the input node to receive the boosted data signal 1102 for processing (e.g., interpreting of encoded data in the boosted data signal 1102). FIG. 11 illustrates an example of a slew rate for the boosted data signal 1102 at the input node of the DRAM memory device. As shown in the example of FIG. 11, a y-axis of the diagram 1100 can represent a slew rate in G over time (e.g., measured in V/ns)), and an x-axis of the diagram 1100 can represent time in ns. In contrast to the data signal 1002, the boosted data signal 1102 can have an increased slew rate at the input node of the DRAM memory device.

Figure 12:
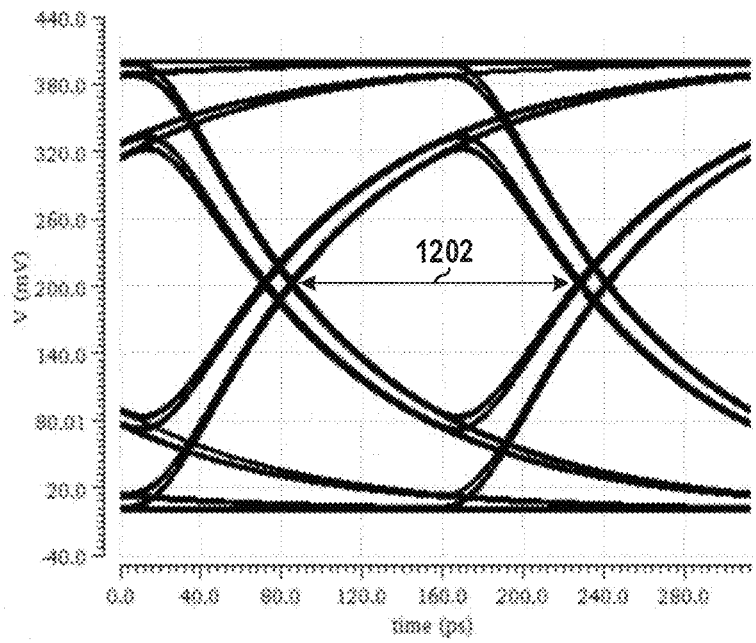
FIG. 12 is an example of an eye diagram without boosted signal.

FIG. 12 is an example of an eye diagram 1200. The eye diagram 1200 can be associated with a receiver circuit. The receiver circuit can be employed at a DRAM memory device. The DRAM memory device can include an input node that can be coupled to an interposer channel to couple the DRAM memory device to a host device. The host device can include a non-signal boosting transmitter circuit that can be configured to generate data signals, which can be communicated over the interposer channel to the receiver circuit. The eye diagram 1200 can characterize a performance (e.g., signal quality) of the data signals at the input node of the DRAM memory device. As shown in the example of FIG. 12, a y-axis of the eye diagram 1200 can represent a voltage in mV and an x-axis of the eye diagram 1200 can represent a time in picoseconds (ps). Because the non-slew boosting transmitter circuit is configured without the signal transition boosting circuit 136, as shown in FIG. 1, an eye width 1202 of the eye diagram 1200 is reduced (e.g., smaller) in contrast to the eye diagram 1300, as shown in FIG. 13.

Figure 13:
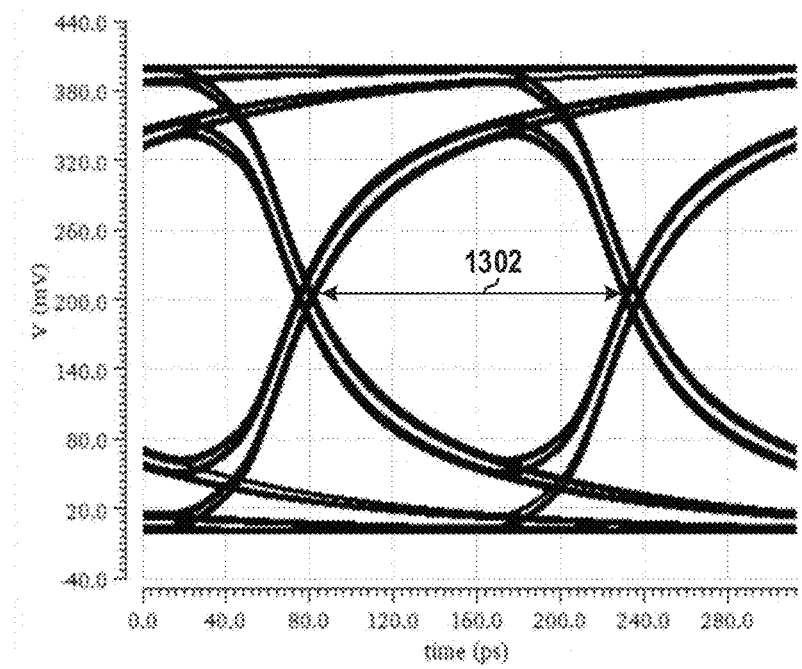
FIG. 13 is an example of another eye diagram with boosted signal.

FIG. 13 is an example of an eye diagram 1300. The eye diagram 1300 can be associated with the receiver circuit 114, as shown in FIG. 1. Thus, in some examples, reference can be to FIGS. 1-5 in the example of FIG. 13. The receiver circuit 114 can be employed at a DRAM memory device, in some examples, the memory device 106, as shown in FIG. 1. The DRAM memory device can include an input node (e.g., the second input node 132, as shown in FIG. 1). The input node can be coupled to an interposer channel (e.g., the communication channel 110, as shown in FIG. 1) to couple the DRAM memory device to a host device (e.g., the host device 102, as shown in FIG. 1). In some examples, the host device includes an output node (e.g., the output node 124, as shown in FIG. 1,). The interposer channel can be coupled to the output node. The host device can employ the transmitter circuit 112, as shown in FIG. 1, to generate boosted data signals (e.g., similar to the boosted data signal 134, as shown in FIG. 1). The eye diagram 1300 can characterize a performance (e.g., signal quality) of the boosted data signals outputted by the transmitter circuit 112 at the input node of the DRAM memory device.

As shown in the example of FIG. 13, a y-axis of the eye diagram 1300 can represent a voltage in mV and an x-axis of the eye diagram 1300 can represent a time in ps. Because the transmitter circuit 112 is configured with the signal transition boosting circuit 136, as shown in FIG. 1, an eye width 1302 of the eye diagram 1300 for the receiver circuit can be improved in contrast to the eye diagram 1200 for the receiver circuit, as shown in FIG. 12. Accordingly, the eye width 1302 of the eye diagram 1300 can be improved in contrast to the eye width 1202 of the eye diagram 1300.

Figure 14:
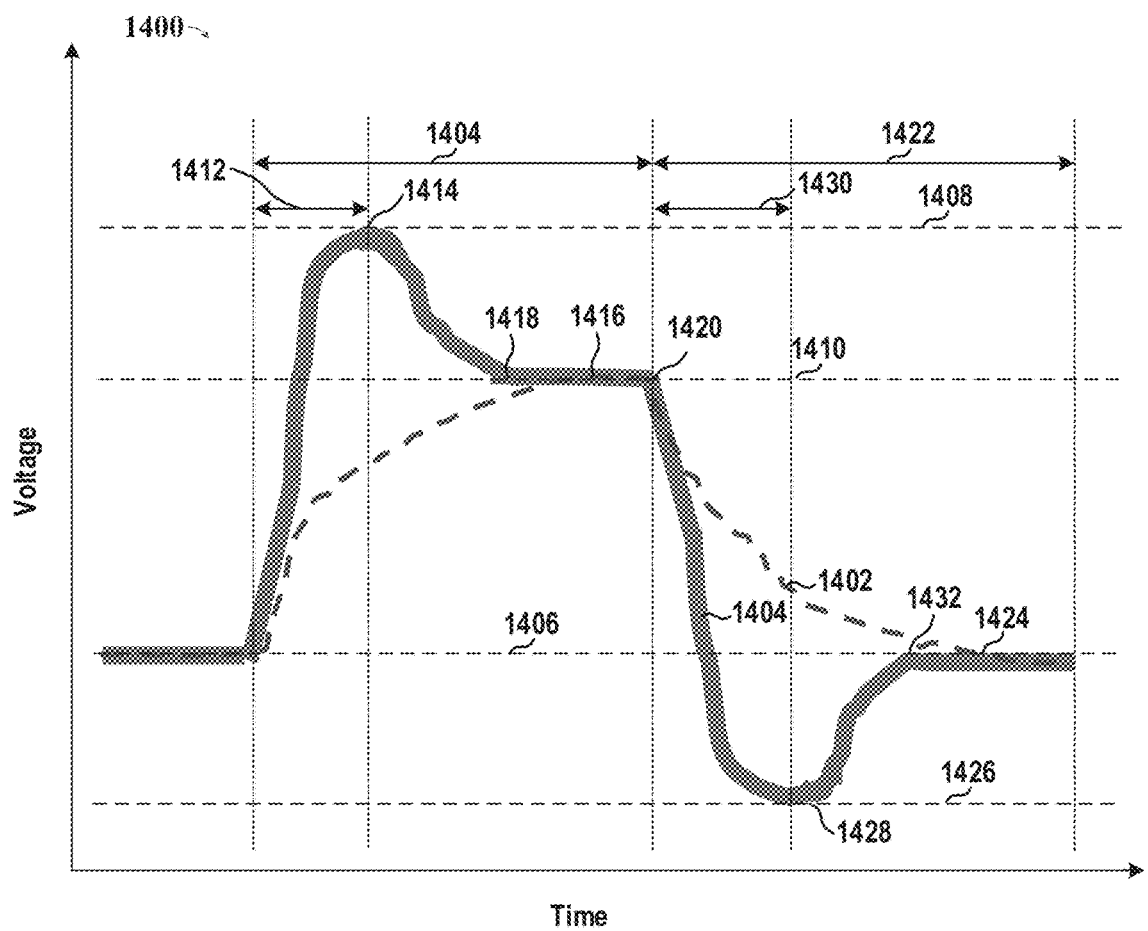
FIG. 14 is an example of a diagram illustrating a non-boosted data signal and a boosted data signal at a near end.

FIG. 14 is an example of a diagram 1400 that includes a non-boosted data signal 1402 and a boosted data signal 1404. The boosted data signal 1402 can be the boosted data signal 134, as shown in FIG. 1. Thus, in some examples, reference can be to FIGS. 1-5 in the example of FIG. 14. The non-boosted data signal 1402 can be generated by a non-signal boosting transmitter circuit at an output node of an interface circuit of a host device. The boosted data signal 1404 can be generated by the transmitter circuit 112 at the output node 124 of the interface circuit 104 of the host device 102. The term "near end" as used herein can refer to a node of a data signal communicating device or circuit. For example, if the transmitting device or circuit is the host device 102 or the transmitter circuit 112, the output node 124 can be referred to as the near end. As shown in the example of FIG. 14, a y-axis of the diagram 1400 can represent a voltage in volts and an x-axis of the diagram 1400 can represent time.

As described herein, the signal transition boosting circuit 136 of FIG. 1 can be configured to provide electrical charge at given a charge pump rate to the output node 124 based on the boost timing signal 144. The provided electrical charge can be representative of the boosting signal 142, as shown in FIG. 1. The signal transition boosting circuit 136 can be configured to pump electrical charge representative of the data signal 142 to the output node 124. The data signal 122 can be combined with the boost data signal 142 to provide the boosted data signal 1404.

By way of example, during a first period of time 1404, the boosted data 1404 can increase from a first voltage reference 1406 to a second voltage reference 1408. During the first period of time 1404, the non-boosted data signal 1402 can increase from the first voltage reference 1406 to a third voltage reference 1410. The second voltage reference 1408 can be greater than the third voltage reference 1410, which can be greater than the first voltage reference 1406. During the first period of time 1404, an amplitude of the non-boosted data signal 1402 can increase at a first signal transition rate. During the first period of time 1404, an amplitude of the boosted data signal 1404 can increase at a second signal transition rate. Because the signal transition boosting circuit 136 provides an additional electrical charge to the output node 124, the boosted data signal 1404 can have a greater signal transition rate. As such, the boosted data signal 1404 can have a greater voltage slew rate at the output node 132 in contrast to the non-boosted data signal at the output node.

The signal transition boosting circuit 136 can be configured to pump the additional electrical charges to the output node 124 during a first boosting period of time (e.g., the first boosting period of time 308, as shown in FIG. 3) of the boost timing signal 144. As such, an amplitude of the boosted data signal 1402 can increase from the first voltage reference 1406 to about the second voltage reference 1410 during a second period of time 1412. At about a first instance of time 1414, the amplitude of the boosted data signal 1404 can be at about the second voltage reference 1408 and can be referred to as a positive peak voltage of the boosted data signal 1404. Because the non-boosted data signal 1402 is generated by the non-signal boosting transmitter circuit, an amplitude of the non-boosted data signal 1402 can increase during the first period of time 1404 to third voltage reference 1410 at about a second instance of time 1416. The amplitude of the non-boosted data signal 1402 can be at about the third voltage reference 1410 and can be referred to as a positive peak voltage of the non-boosted data signal 1402.

In some examples, at about the first instance of time 1414, the signal transition boosting circuit 136 stops provide electrical charge to the output node 124 during a second boosting period of time (e.g., the second boosting period of time 310, as shown in FIG. 3) of the boost timing signal 144. The amplitude of the boosted data signal 1404 can decrease from the positive peak voltage at about the first instance of time 1414 to about the third voltage reference 1410 at a third instance in time 1418 during a remainder of the first period of time 1404. During the first period of time 1404, the main driver circuit 120 can be configured to continue to provide electrical charge to maintain the amplitude of the boosted data signal 1402 at about the third instance of time 1418 to about a fourth instance in time 1420. During the first period of time 1404, the non-boosted and boosted data signals 1402 and 1404 can be in a first logical state (e.g., represent a logical value of one (1)).

By way of further example, during a third period of time 1422, the non-boosted and boosted data signals 1402 and 1404 can be in a second logical state (e.g., represent a logical value of zero (1)). During the third period of time 1422, the non-boosted data signal 1402 can decrease from the third voltage reference 1410 at about the fourth instance of time 1420 to the first voltage reference 1406 at about a fifth instance in time 1424. During the third period of time 1422, the boosted data signal 1404 can decrease from the third voltage reference 1410 at about the fourth instance of time 1420 to a fourth voltage reference 1426 at about a sixth instance in time 1428. The signal transition boosting circuit 136 can be configured to provide electrical charge to the output node 124 during the first boosting period of time (e.g., the first boosting period of time 308, as shown in FIG. 3) of the boost timing signal 144. As such, an amplitude of the boosted data signal 1402 can decrease from the third voltage reference 1410 to about the fourth voltage reference 1410 during a fourth period of time 1430. At about the sixth instance of time 1428, the amplitude of the boosted data signal 1404 can be at about the fourth voltage reference 1426 and can be referred to as a negative peak voltage of the boosted data signal 1404.

Because the non-boosted data signal 1402 is generated by the non-signal boosting transmitter circuit, a signal transition rate of the non-boosted data signal 1402 is less than a signal transition rate of the boosted data signal 1404 during the third period of time 1430. Thus, a greater amount of time is needed for the non-boosted data signal 1402 to transition from the third voltage reference 1410 at about the fourth instance of time 1420 to the first voltage reference 1406 at about the fifth instance in time 1424. In some examples, at about the sixth instance of time 1428, the signal transition boosting circuit 136 provides a decreasing amount of electrical charge to the output node 124 during the second boosting period of time (e.g., the second boosting period of time 310, as shown in FIG. 3) of the boost timing signal 144. For example, when the boost timing signal 144 provided to the boost driver circuit 138 transitions from 1 to 0, the boost driver circuit 138 can be configured to pump negative charge to node 124 to cause the voltage at node 124 to become negative at about the sixth instance of time 1428.

The amplitude of the boosted data signal 1404 can increase from the negative peak voltage at about the sixth instance of time 1428 to about the first voltage reference 1406 at about a seventh instance in time 1432. During the third period of time 1422, the boost driver circuit 136 can be configured to stop providing negative electrical charge at about the seventh instance in time 1424 to maintain the amplitude of the boosted data signal 1404 at about the first voltage reference 1406.

Figure 15:
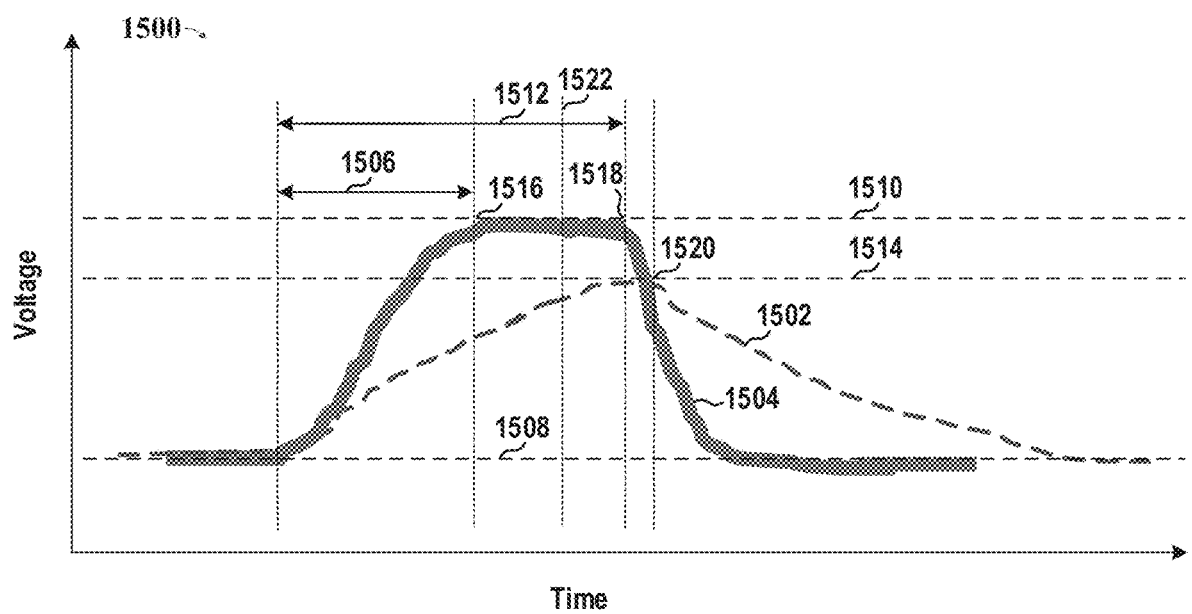
FIG. 15 is an example of a diagram illustrating a non-boosted data signal and a boosted data signal at a far end.

FIG. 15 is an example of a diagram 1500 illustrating a non-boosted data signal 1502 and a boosted data signal 1504 received at a far end. The non-boosted data signal 1502 and boosted data signal 1504 can be representative of a respective logical state, such as a first logical state (e.g., representing a logical value of one (1)). The boosted data signal 1504 can be the boosted data signal 134, as shown in FIG. 1. Thus, in some examples, reference can be to FIGS. 1-5 in the example of FIG. 15. The non-boosted data signal 1502 can be generated by a non-signal boosting transmitter circuit of a host device. The non-boosted data signal 1502 can be communicated over a communication channel (e.g., a conductive channel) to a memory device. The memory device can include an input node for receiving the non-boosted data signal 1502. As described herein, the boosted data signal 1504 can be generated by the transmitter circuit 112 and provided over the communication channel 110 to the memory device 106. The memory device 106 includes the input node 132 for receiving the non-boosted data signal 1502. The term "far end" as used herein can refer to a node of a data signal receiving device or circuit. For example, if the receiving device is the memory device 106, the input node 132 can be referred to as the far end. As shown in the example of FIG. 15, a y-axis of the diagram 1500 can represent a voltage in volts and an x-axis of the diagram 1500 can represent time.

By way of example, during a first period of time 1506, the boosted data signal 1504 can increase from a first voltage reference 1508 to a second voltage reference 1510. In some examples, during a second period of time 1512, the non-boosted data signal 1502 can increase from the first voltage reference 1508 to a third voltage reference 1514. As shown in FIG. 15, the third voltage reference 1514 can be less than the second voltage reference 1510 but greater than the first voltage reference 1508. The boosted data signal 1504 can have an amplitude that increases at a greater signal transition rate in contrast to the non-boosted data signal 1502, as shown in FIG. 15. As such, the boosted data signal 1504 can have a greater voltage slew rate at the input node 132 of the memory device 106 in contrast to the non-boosted data signal at the input node of the memory device.

In some examples, at about a first instance of time 1516, the amplitude of the boosted data signal 1504 can be at about the second voltage reference 1510 and can be referred to as a positive peak voltage of the boosted data signal 1504. At about the first instance of time 1516, the signal transition boosting circuit 136 can be configured to stop provide electrical charge and the main driver circuit 120 can be configured to continue to provide electrical charge to maintain the amplitude of the boosted data signal 1502 at the second voltage reference 1510 from about the first instance of time 1516 to about a second instance of time 1518. In some examples, at about a third instance of time 1520, the amplitude of the non-boosted data signal 1502 can be at about the third voltage reference 1514 and can be referred to as a positive peak voltage of the non-boosted data signal 1502.

Because of channel effects of the communication channel over which the non-boosted and boosted data signals 1502 and 1504 are transmitted to a corresponding memory device, the non-boosted data signal 1502 is shifted in time with respect to the boosted data signal 1504 at a respective input node of the memory device. For example, as shown in FIG. 15, the boosted data signal 1504 peaks at about the first instance of time 1516 which is earlier in contrast to the non-boosted data signal 1504, which peaks at the third instance of time 1520. In some examples, a data signal sampling circuit at the memory device can be configured to sample a received data signal and provide the sampled data signal to a determination circuit at the memory device for determining a logical state represented by the sampled data signal. The determination circuit can be configured to determine that the sampled data signal is in the first logical state based on the sampled data signal (e.g., determining that an amplitude of the sampled data signal is greater or less than the third voltage reference 1520, as shown in FIG. 15).

By way of example, the data signal sampling circuit can be configured to sample a received data signal at about a fourth instance of time 1522. For example, the data signal sampling circuit can be configured to sample the non-boosted data signal 1522 at about the fourth instance of time 1522. Because of the channel effects, the data signal sampling circuit samples the non-boosted data signal 1502 on a signal transition portion, such as a rising edge of the non-boosted data signal 1502. As such, the non-boosted data signal 1502 can have an amplitude that is less than the third voltage reference. Thus, errors may be introduced into sampled data as the determination circuit may not be able to determine whether the non-boosted data signal 1502 is representative of the first logical state or the second logical state. Because the amplitude of the boosted data signal 1502 is at about the second voltage reference 1510 at about the fourth instance of time 1522, the determination circuit can accurately determine that the boosted data signal 1504 is representative of the first logical state.

What has been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A circuit comprising:
    a driver circuit coupled to an output node and configured to provide a data signal to the output node based on an input signal, wherein the data signal has a similar logical state as the input signal; and
    a signal transition boosting circuit coupled to the output node and configured to provide a boosting signal to the output node based on the input signal and a charge pump delay adjustment signal, the charge pump delay adjustment signal defining an amount of time after which the boosting signal is provided to the output node, wherein the boosting signal is provided to the output node to signal boost the data signal for the amount of time defined by the charge pump delay adjustment signal to provide a boosted data signal at the output node.

2. The circuit of claim 1, wherein the boosted data signal has a respective signal transition portion that transitions at a greater signal transition rate corresponding to a greater voltage slew rate than a respective signal transition portion of the data signal.

3. The circuit of claim 2, wherein the signal transition boosting circuit comprises a boost driver circuit and a boost delay circuit, the boost driver circuit being configured to provide the boosting signal based on a boost timing signal, the boost timing signal being outputted by the boost delay circuit based on the charge pump delay adjustment signal to cause the boost driver circuit to provide the boosting signal for a period of time corresponding to the amount of time defined by the charge pump delay adjustment signal.

4. The circuit of claim 3, wherein the boost timing signal is in a first logical state during a first boosting period of time and in a second logical state during a second boosting period of time, the boost driver circuit being configured to provide the boosting signal in a first logical state in response to the boost timing signal being in the first logical state during the first boosting period of time, and in the second logical state in response to the boost timing signal being in the second logical state during the second boosting period of time.

5. The circuit of claim 4,
wherein the boost driver circuit comprises a boost input drive circuit and a boost driver circuit, the boost input drive circuit being configured to provide a first boost driver signal to the boost driver circuit based on the boost timing signal being in the first logical state to drive the boost driver circuit to provide the boosting signal in the first logical state, and
wherein the boost input drive circuit being configured to provide a second boost driver signal to the boost driver circuit based on the boost timing signal being in the second logical state to drive the boost driver circuit to provide the boosting signal in the second logical state.

6. The circuit of claim 5,
wherein the driver circuit comprises an input driver circuit and an output driver circuit, the input drive circuit being configured to provide a first driver signal to the output driver circuit based on the input signal being in a first logical state to drive the output driver circuit to provide the data signal in a first logical state, and
wherein the input drive circuit being configured to provide a second driver signal based on the input signal being in a second logical state to the output driver circuit to drive the output driver circuit to provide the data signal in a second logical state.

7. The circuit of claim 6,
wherein the boost input drive circuit is configured to provide the first and second boost driver signals further based on a boost enable signal, and
wherein the input driver circuit is configured to provide the first and second driver signals further based on the boost enable signal.

8. The circuit of claim 7, further comprising a transmitter circuit that includes the driver circuit and the signal transition boosting circuit, the transmitter circuit further including the output node.

9. The circuit of claim 8, further comprising an interface circuit that includes the transmitter circuit, wherein the output node is coupled via a communication channel to an input node of a memory device to enable a host device to communicate with the memory device, the host device being one of coupled to the input node of the interface circuit or including the interface circuit.

10. The circuit of claim 9, wherein the memory device is a high bandwidth memory (HBM) memory device.

11. A system comprising:
an interface circuit comprising:
a transmitter circuit comprising:
an output node;
a driver circuit coupled to the output node and configured to drive the output node for a period of time to provide electrical charge to the output node, the electrical charge being provided to the output node for the period of time being representative of a data signal in a respective logical state; and
a signal transition boosting circuit coupled to the output node and configured to drive the output node for a portion of the period of time to provide additional electrical charge to the output node, the additional electrical charge being provided to the output node being representative of a boosting signal, wherein the boosting signal is provided to the output node to signal boost the data signal for the portion of the period of time to provide a boosted data signal.

12. The system of claim 11, wherein the boosted data signal has a respective signal transition portion that transitions at a greater signal transition rate corresponding to a greater voltage slew rate based on the additional electrical charge provided during the portion of the period of time than a respective signal transition portion of the data signal.

13. The system of claim 12, wherein the signal transition boosting circuit is configured to provide the boosting signal to the output node based on the input signal and a charge pump delay adjustment signal, the charge pump delay adjustment signal defining an amount of time after which the boosting signal corresponding to the additional electrical charge is provided to the output node, the amount of time defined by the charge pump delay adjustment signal corresponding to the delay in time.

14. The system of claim 13, wherein the signal transition boosting circuit comprises a boost driver circuit and a boost delay circuit, the boost driver circuit being configured to provide the boosting signal based on a boost timing signal, the boost timing signal being outputted by the boost delay circuit based on the charge pump delay adjustment signal to cause the boost driver circuit to provide the boosting signal during the portion of the period of time.

15. The system of claim 14, wherein the boost timing signal is in a respective logical state for a boosting period of time, the boost driver circuit being configured to provide the boosting signal in a respective logical state based on the boost timing signal being the respective logical state during the boosting period of time, wherein the boosting period of time overlaps with the portion of the period of time.

16. The system of claim 15,
wherein the boost driver circuit comprises a boost input drive circuit and a boost driver circuit, the boost input drive circuit being configured to provide a boost driver signal to the boost driver circuit to cause the boost driver circuit to provide the boosting signal in the respective logical state to the output node, and
wherein the driver circuit comprises an input driver circuit and an output driver circuit, the input drive circuit being configured to provide a driver signal to the output driver circuit to cause the output driver circuit to provide the data signal in the respective logical state to the output node.

17. The system of claim 16, wherein the interface circuit is a first interface circuit, the system further comprising a second interface circuit, the second interface circuit comprising an input node, the output node being coupled via a conductive communication channel to the input node of the second interface circuit to enable the boosted data signal to propagate from the output node of the first interface circuit over the communication channel to the input node of the second interface circuit.

18. The system of claim 17, wherein one of:
the first interface circuit is part of a host device and the second interface circuit is part of a memory device; and
the first interface circuit is part of the memory device and the second interface circuit is part of the host device.

19. A transmitter circuit comprising:
an output node;
a main driver circuit comprising:
  a main input drive circuit being configured to provide a driver signal based on an input signal in a respective logical state;
  an output driver circuit being coupled to the output node and being configured to provide electrical charge for a period of time to the output node in response to the driver signal, the electrical charge being provided to the output node during the period of time being representative of a data signal in a respective logical state, wherein the respective logical state of the data signal is similar to the respective logical state of the input signal;
a boost driver circuit comprising
  a boost input drive circuit being configured to provide a boost driver signal based on a boost timing signal being in a respective logical state for a portion of the period of time; and
  a boost driver circuit being coupled to the output node and configured to provide additional electrical charge to the output node during the portion of the period of time in response to the boost driver signal, the additional electrical charge being provided to the output node being representative of a boosting signal, wherein the boosting signal is provided to the output node to signal boost the data signal for the portion of the period of time to provide a boosted data signal at the output node.

20. The transmitter circuit of claim 19, further comprising a boost delay circuit configured to generate the boost timing signal based on a charge pump delay adjustment signal, the charge pump delay adjustment signal defining an amount of time after which the boosting signal corresponding to the additional electrical charge is provided to the output node, the amount of time defined by the charge pump delay adjustment signal corresponding to the delay in time.

* * * * *